United States Patent
Ko et al.

(10) Patent No.: US 10,720,526 B2
(45) Date of Patent: Jul. 21, 2020

(54) STRESS MODULATION FOR DIELECTRIC LAYERS

(71) Applicant: Taiwan Semiconductor Manufacturing Company, Ltd., Hsinchu (TW)

(72) Inventors: Chung-Ting Ko, Kaohsiung (TW); Han-Chi Lin, Kaohsiung (TW); Chunyao Wang, Zhubei (TW); Ching Yu Huang, Baoshan Township (TW); Tze-Liang Lee, Hsinchu (TW); Yung-Chih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/057,243

(22) Filed: Aug. 7, 2018

(65) Prior Publication Data

US 2020/0006557 A1  Jan. 2, 2020

Related U.S. Application Data

(60) Provisional application No. 62/691,942, filed on Jun. 29, 2018.

(51) Int. Cl.
*H01L 29/78*  (2006.01)
*H01L 21/762*  (2006.01)
(Continued)

(52) U.S. Cl.
CPC ...... *H01L 29/7843* (2013.01); *H01L 21/0217* (2013.01); *H01L 21/0228* (2013.01);
(Continued)

(58) Field of Classification Search
CPC ......... H01L 27/10832; H01L 27/10826; H01L 27/10879; H01L 27/1087; H01L 27/10891; H01L 21/324; H01L 29/66975
(Continued)

(56) References Cited

U.S. PATENT DOCUMENTS 7,795,160 B2  9/2010 Wang et al.
8,815,741 B1 *  8/2014 Richter et al. ........ H01L 21/311
438/696

(Continued)

FOREIGN PATENT DOCUMENTS

| KR | 20090033482 A | 4/2009 |
| KR | 20140113477 A | 9/2014 |
| KR | 20170052433 A | 5/2017 |

OTHER PUBLICATIONS

Meng, et al., "Atomic Layer Deposition of Silicon Nitride Thin Films: A Review of Recent Progress, Challenges and Outlooks," MDPI—Materials, vol. 9, Issue 12, Dec. 12, 2016, 20 pages.

*Primary Examiner* — Thinh T Nguyen
(74) *Attorney, Agent, or Firm* — Slater Matsil, LLP

(57) ABSTRACT

A method includes etching a first portion and a second portion of a dummy gate stack to form a first opening and a second opening, respectively, and depositing a silicon nitride layer to fill the first opening and the second opening. The deposition of the silicon nitride layer comprises a first process selected from treating the silicon nitride layer using hydrogen radicals, implanting the silicon nitride layer, and combinations thereof. The method further includes etching a third portion of the dummy gate stack to form a trench, etching a semiconductor fin underlying the third portion to extend the trench down into a bulk portion of a semiconductor substrate underlying the dummy gate stack, and depositing a second silicon nitride layer into the trench.

20 Claims, 28 Drawing Sheets

(51) Int. Cl.
    *H01L 21/3213*    (2006.01)
    *H01L 21/02*      (2006.01)
    *H01L 21/3115*    (2006.01)
    *H01L 29/66*      (2006.01)
    *H01L 21/3065*    (2006.01)
    *H01L 27/088*     (2006.01)
    *H01L 21/8234*    (2006.01)

(52) U.S. Cl.
    CPC .... *H01L 21/0234* (2013.01); *H01L 21/02208* (2013.01); *H01L 21/3065* (2013.01); *H01L 21/31155* (2013.01); *H01L 21/32133* (2013.01); *H01L 21/76224* (2013.01); *H01L 21/823431* (2013.01); *H01L 21/823437* (2013.01); *H01L 21/823481* (2013.01); *H01L 27/0886* (2013.01); *H01L 29/66545* (2013.01); *H01L 29/66795* (2013.01)

(58) Field of Classification Search
    USPC ......... 438/284, 286, 762, 696; 257/401, 506
    See application file for complete search history.

(56) References Cited

U.S. PATENT DOCUMENTS

| | | | |
|---|---|---|---|
| 9,721,848 | B1 | 8/2017 | Bu et al. |
| 9,824,881 | B2 | 11/2017 | Niskanen et al. |
| 9,954,076 | B2 | 4/2018 | Yu et al. |
| 2011/0053339 | A1* | 3/2011 | Ozawa ................. H01L 29/513 438/424 |
| 2014/0103452 | A1 | 4/2014 | Chang et al. |
| 2016/0079054 | A1 | 3/2016 | Chen et al. |
| 2016/0177443 | A1* | 6/2016 | Kumar et al. .... C23C 16/45527 427/255.7 |
| 2017/0345820 | A1 | 11/2017 | Lin et al. |
| 2017/0358584 | A1 | 12/2017 | Wang et al. |
| 2018/0261414 | A1* | 9/2018 | Xie et al. .............. H01L 21/324 |

\* cited by examiner

US 10,720,526 B2

STRESS MODULATION FOR DIELECTRIC LAYERS

PRIORITY CLAIM AND CROSS-REFERENCE

This application claims the benefit of the following provisionally filed U.S. Patent application: Application Ser. No. 62/691,942, filed Jun. 29, 2018, and entitled "Stress Modulation for Dielectric Layers," which application is hereby incorporated herein by reference.

BACKGROUND

In the formation of integrated circuits, multiple layers of different materials are formed. These layers may be removed in subsequent processes, or may be left in the final structure. These layers often have undesirable stresses, which cause problems in the resulting devices. For example, the stress may cause the shift of the positions of some features, and may also cause the drift of electrical properties of some devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
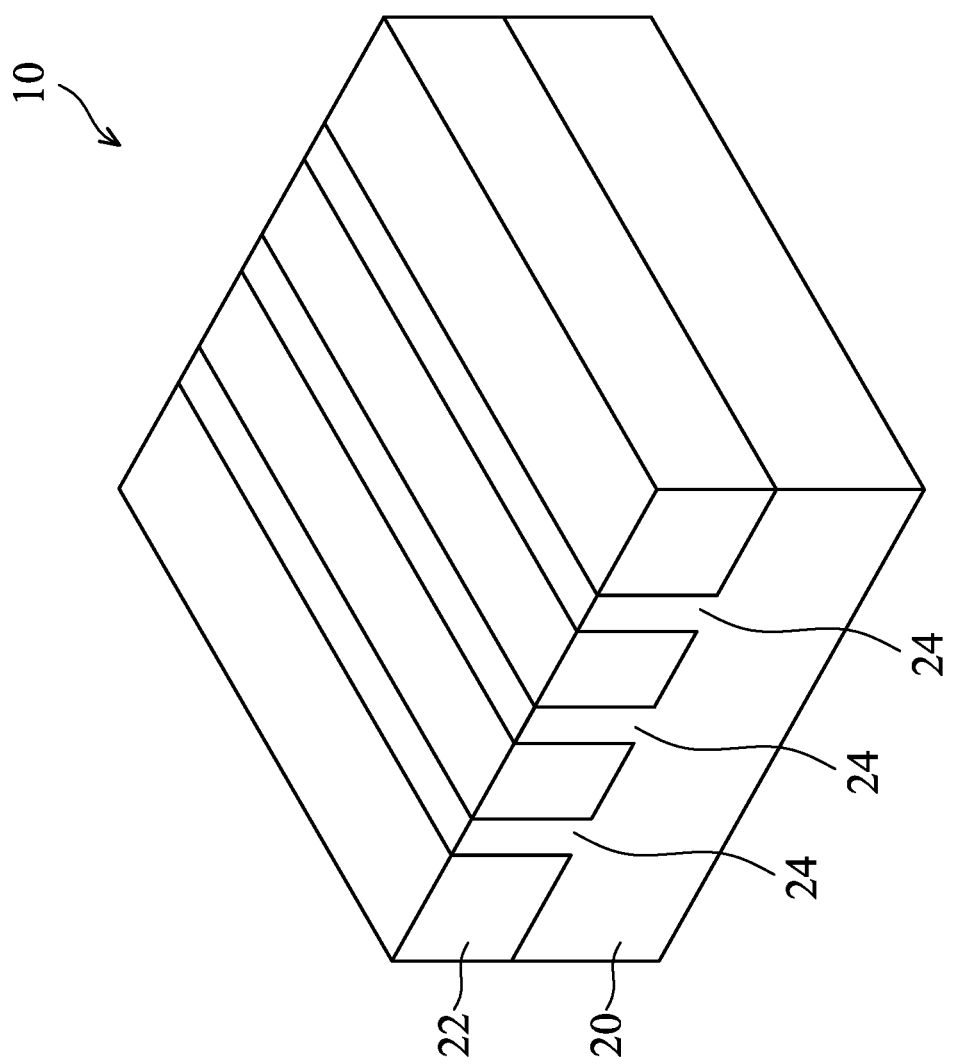
FIGS. 1-4, 5A, 5B, 6A-6D, 7A, 7B, 8, 9A, 9B, 10, 11A, 11B, 12A-12D and 13 illustrate the cross-sectional views, perspective views, and top views of intermediate stages in the formation of Fin Field-Effect Transistors (FinFETs) incorporating silicon nitride layers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure.

Figure 18:
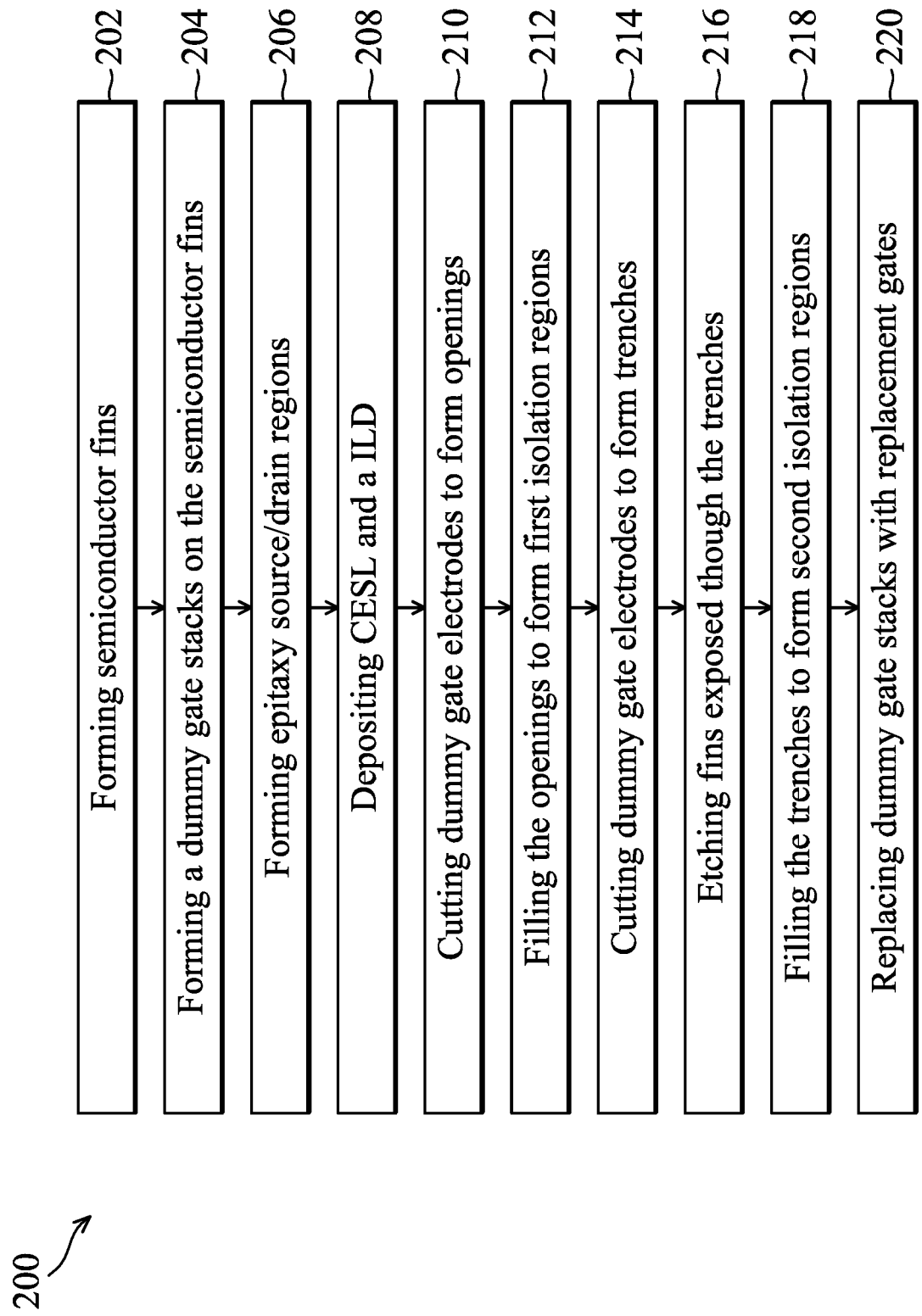
FIG. 18 illustrates a process flow for forming FinFETs in accordance with some embodiments.

FIGS. 1 through 13 illustrate the perspective views, top views, and cross-sectional views of intermediate stages in the formation of FinFETs in accordance with some embodiments of the present disclosure. The processes shown in FIGS. 1 through 13 are also reflected schematically in the process flow 200 as shown in FIG. 18.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
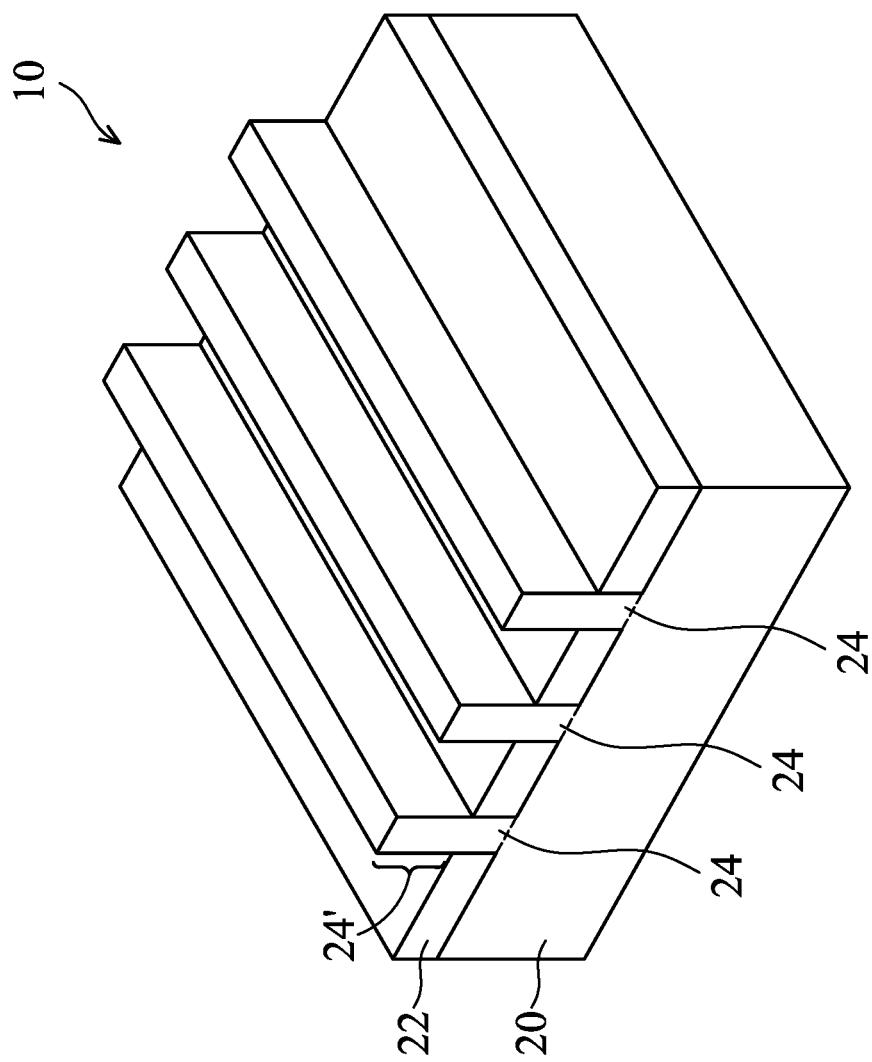

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow 200 as shown in FIG. 18. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
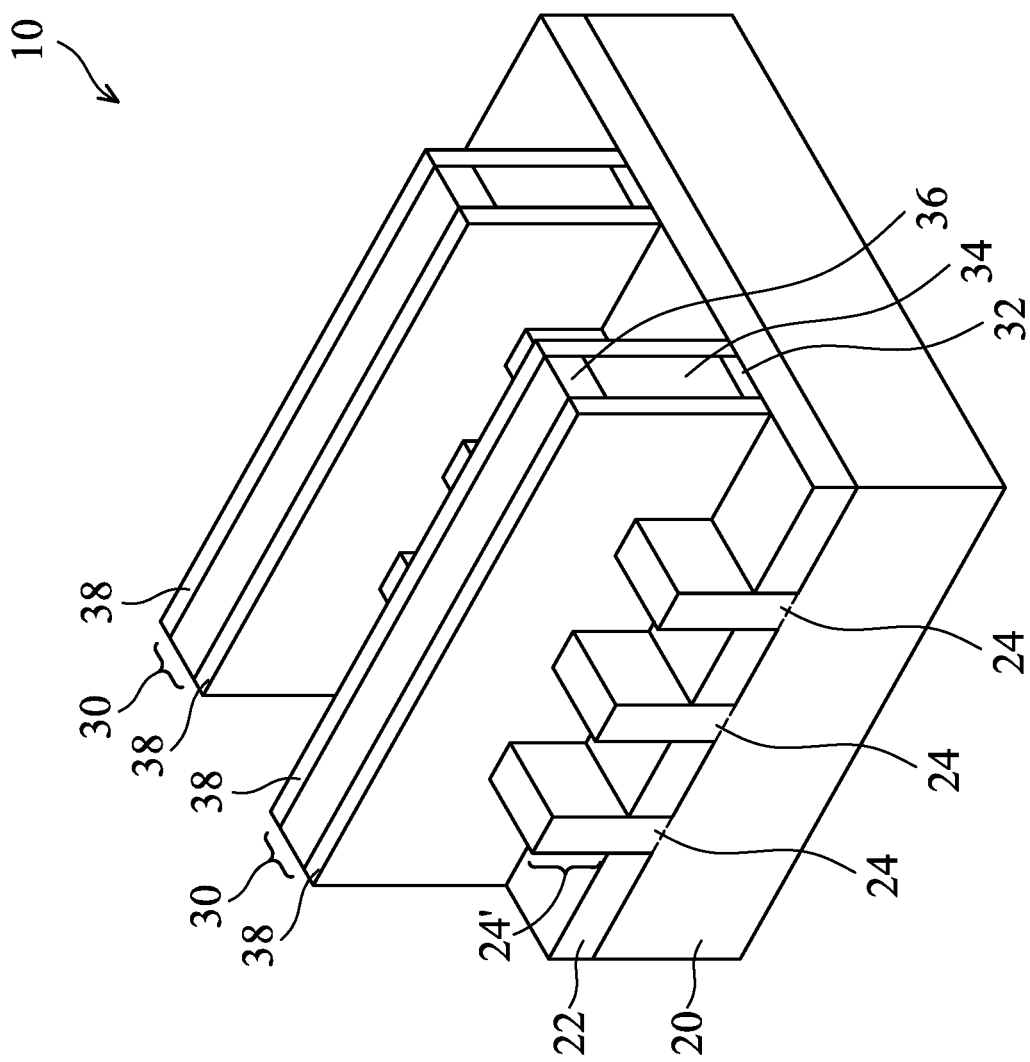

Referring to FIG. 3, dummy gate stacks 30 are formed on the top surfaces and the sidewalls of (protruding) fins 24'. The respective process is illustrated as process 204 in the process flow 200 as shown in FIG. 18. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a plurality of protruding fins 24' and STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon carbo-nitride, or the like, and may have a single-layer structure or a multi-layer structure including a plurality of dielectric layers.

Figure 4:
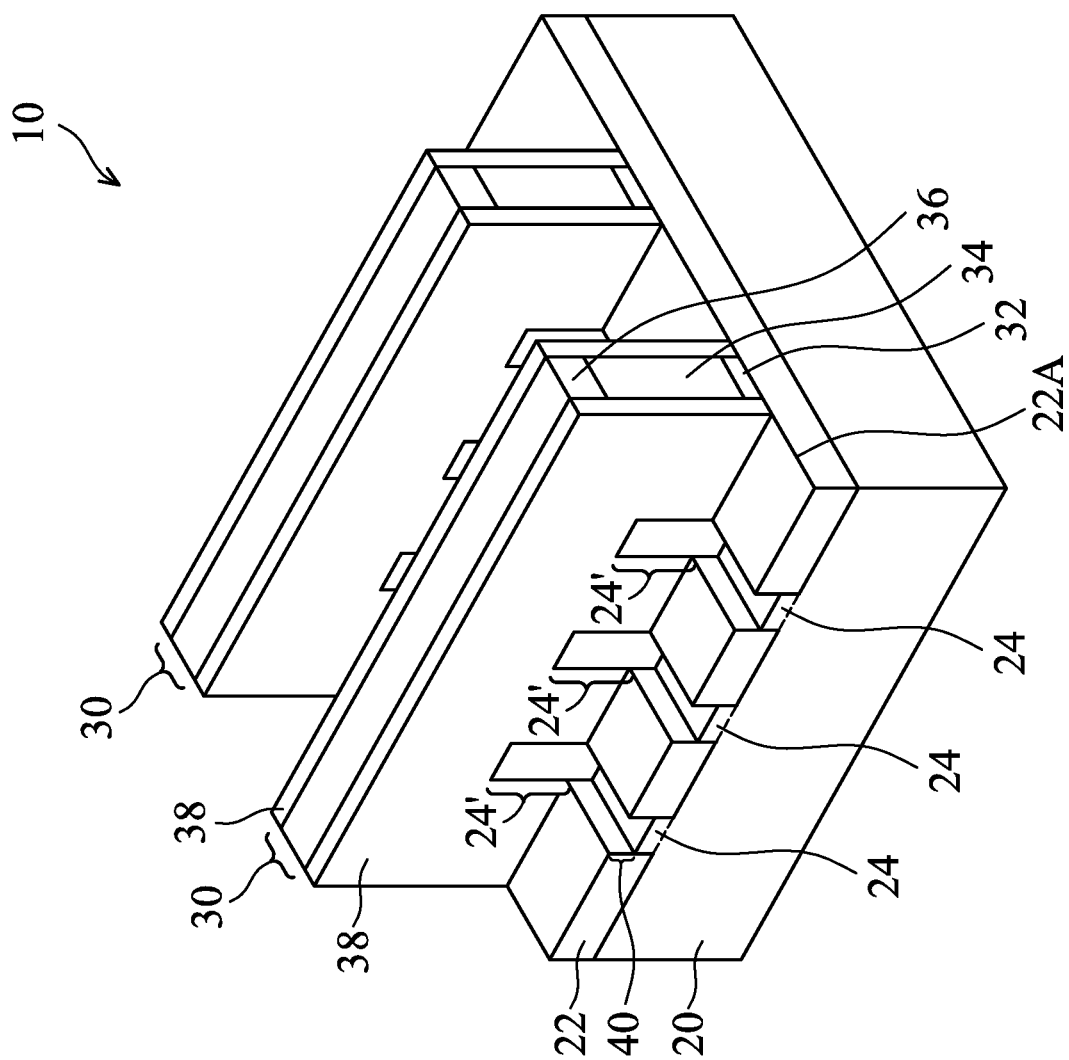

An etching step (referred to as source/drain recessing hereinafter) is then performed to etch the portions of protruding fins 24' that are not covered by dummy gate stacks 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
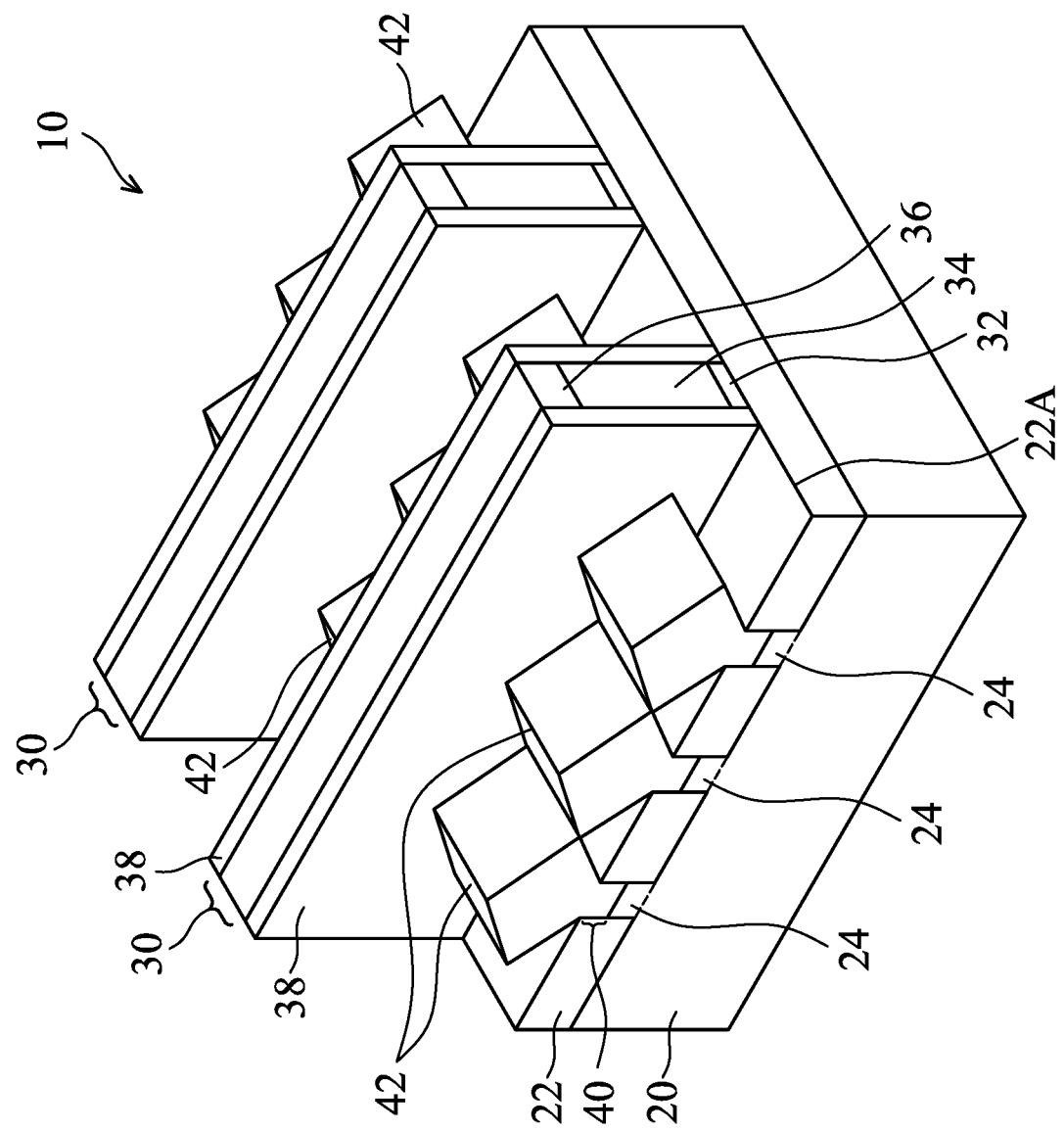

Next, epitaxy regions (source/drain regions) 42 are formed by selectively growing a semiconductor material from recesses 40, resulting in the structure in FIG. 5A. The respective process is illustrated as process 206 in the process flow 200 as shown in FIG. 18. In accordance with some embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
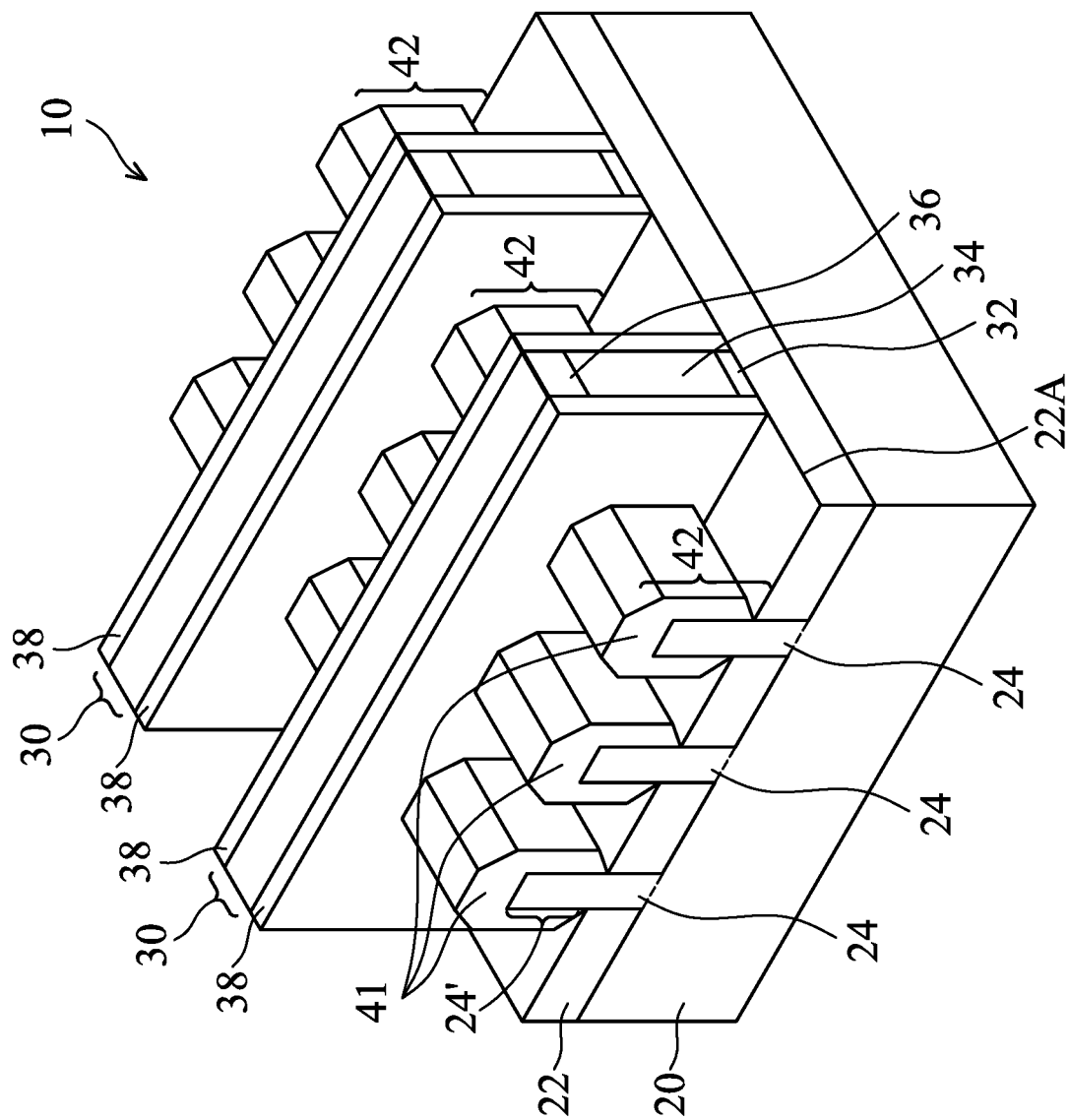

FIG. 5B illustrates the formation of source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy regions 41. An implantation process may be performed to implant an n-type impurity or a p-type impurity.

Figure 6A:
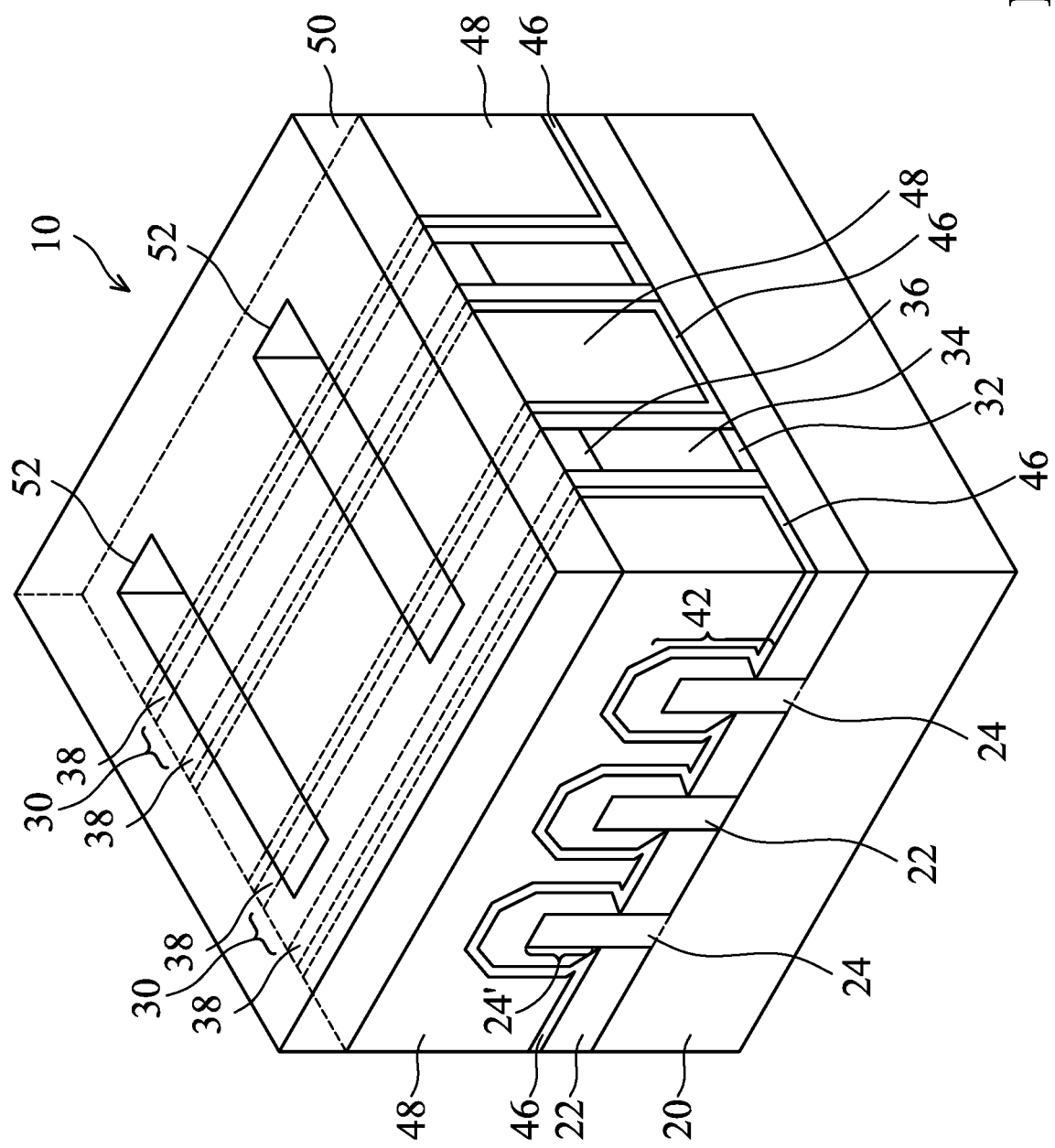

FIG. 6A illustrates a perspective view of the structure after the formation of Contact Etch Stop Layer (CESL) 46 and Inter-Layer Dielectric (ILD) 48. The respective process is illustrated as process 208 in the process flow 200 as shown in FIG. 18. CESL 46 may be omitted in accordance with some embodiments, and when formed, may be formed of silicon nitride, silicon carbo-nitride, or the like. In accordance with some embodiments of the present disclosure, CESL 46 is free from oxygen therein. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Next, process proceeds to the cutting of dummy gate stacks and the cutting of protruding fins 24'. The cutting of dummy gate stacks is shown in FIGS. 6A/6B/6C/6D through FIG. 8, and is alternatively referred to as a cut-poly process since the dummy gate electrodes in the dummy gate stacks may be formed of polysilicon. The respective process is illustrated as process 210 in the process flow 200 as shown in FIG. 18. The cutting of the protruding fins 24' is shown in FIGS. 9A/9B through FIGS. 12A/12B/12C/12D, and is alternatively referred to as a Continuous Poly On Diffusion Edge (CPODE) process. In the illustrative cut-poly and cut-PODE processes, some examples of the cutting positions are illustrated. It is appreciated that the cutting processes may be performed at different positions and with different sizes, depending on the requirement of the transistors.

Referring to FIGS. 6A, 6B, 6C, and 6D, masking layer 50 is formed on the top of the structure shown in preceding steps. Masking layer 50 may be formed of photo resist or other materials such as TiN, SiN, or the like. Referring to FIG. 6A, which shows a perspective view, masking layer 50 is patterned to form openings 52, through which the underlying structures formed in preceding processes are exposed.

Openings 52 are located at the locations wherein some portions of dummy gate stacks 30 may be revealed.

Figure 6B:
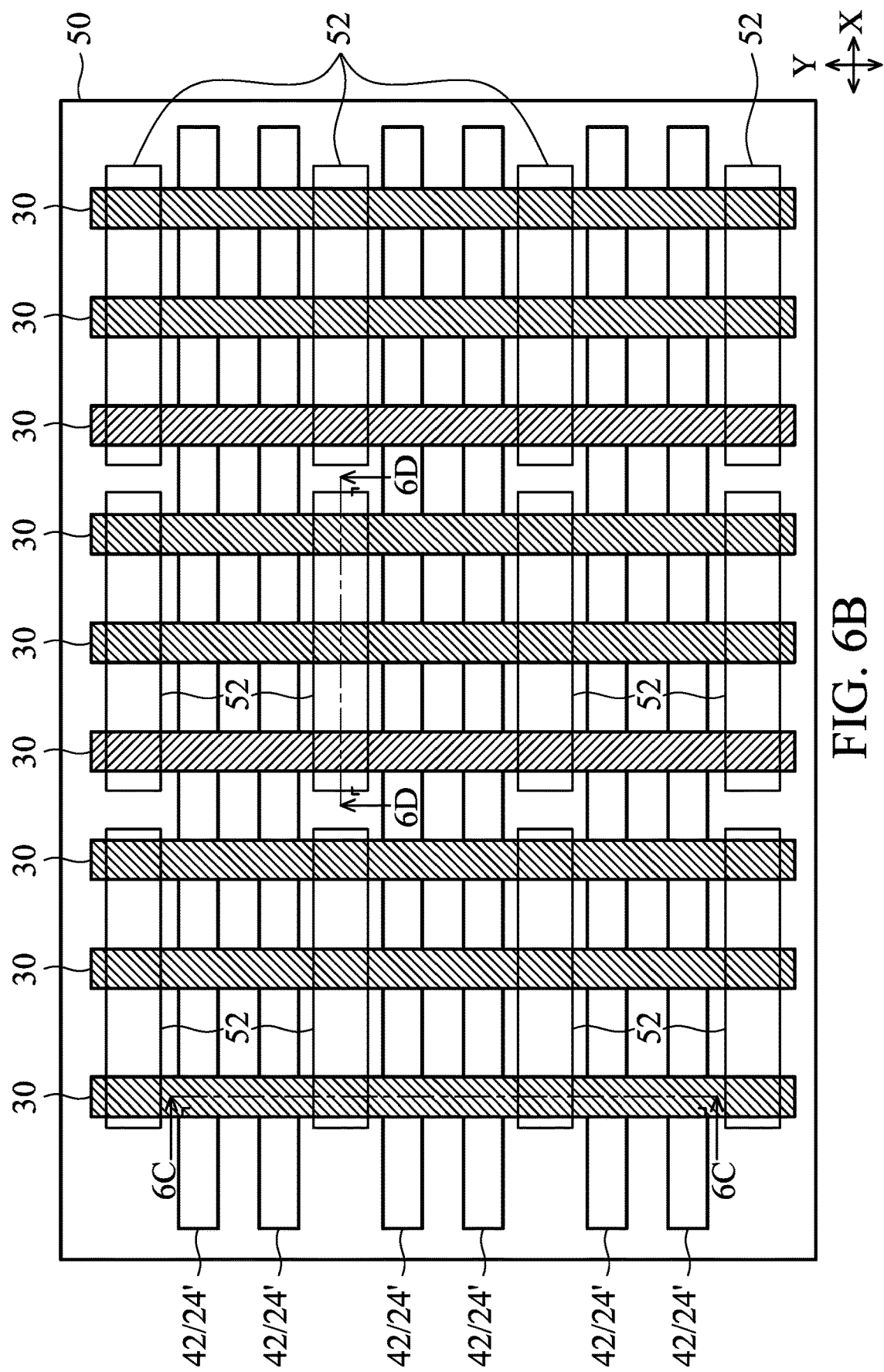

FIG. 6B illustrates a top view of the examples of masking layer 50 and openings 52. In FIG. 6B, a plurality of protruding fins 24' and source/drain regions 42 are allocated in the X-direction, and dummy gate stacks 30 extending in the Y-direction. Protruding fins 24' are directly under dummy gate stacks 30. Source/drain regions 42 are formed between dummy gate stacks 30. ILD 48 and CESL 46 (FIG. 6A) are not shown in FIG. 6B for simplicity. In accordance with some embodiments, each of openings 52 extends to overlap a plurality of dummy gate stacks 30. In accordance with other embodiments of the present disclosure, each of openings 52 is formed to extend over a single dummy gate stack 30.

Figure 6C:
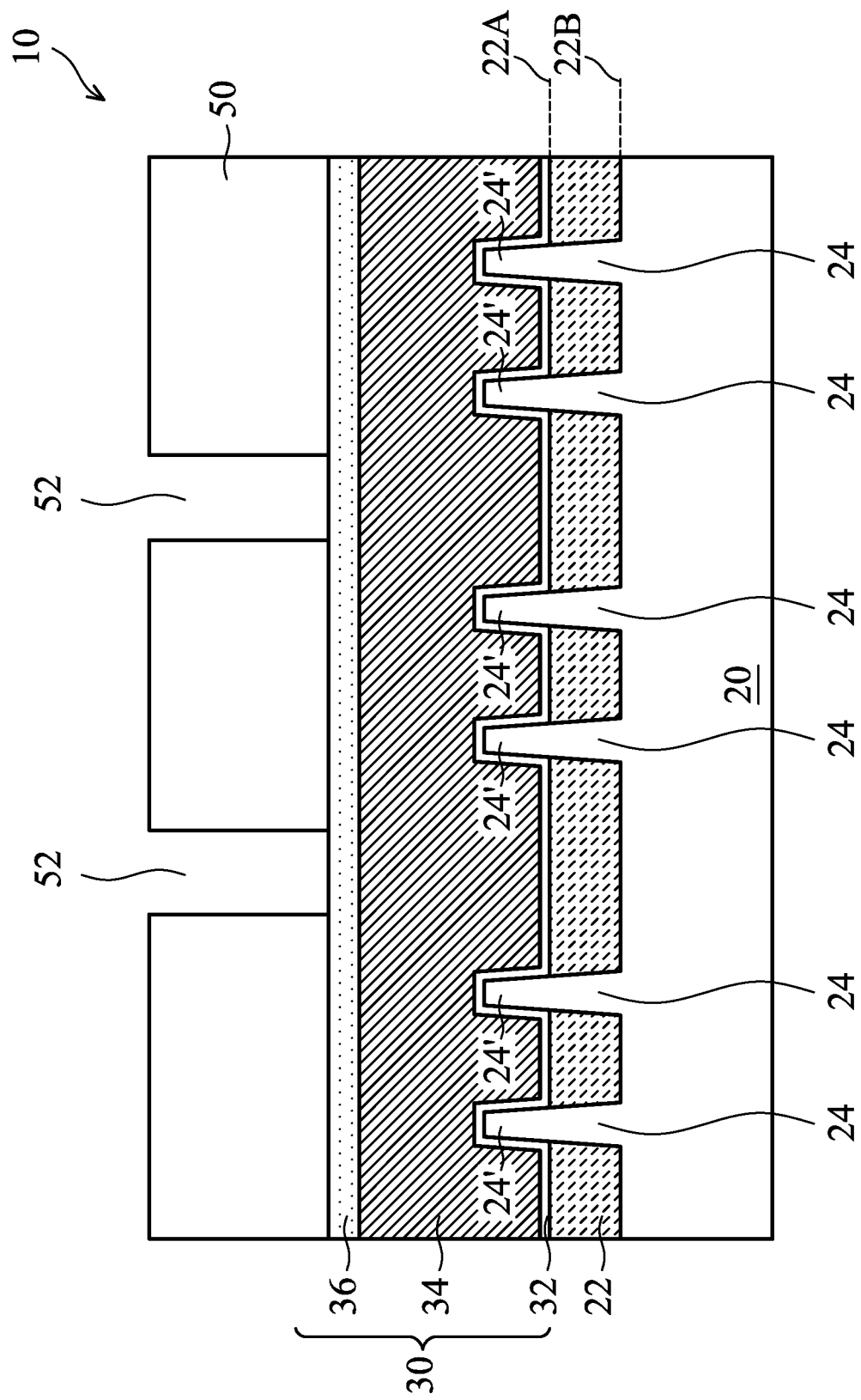
Figure 6D:
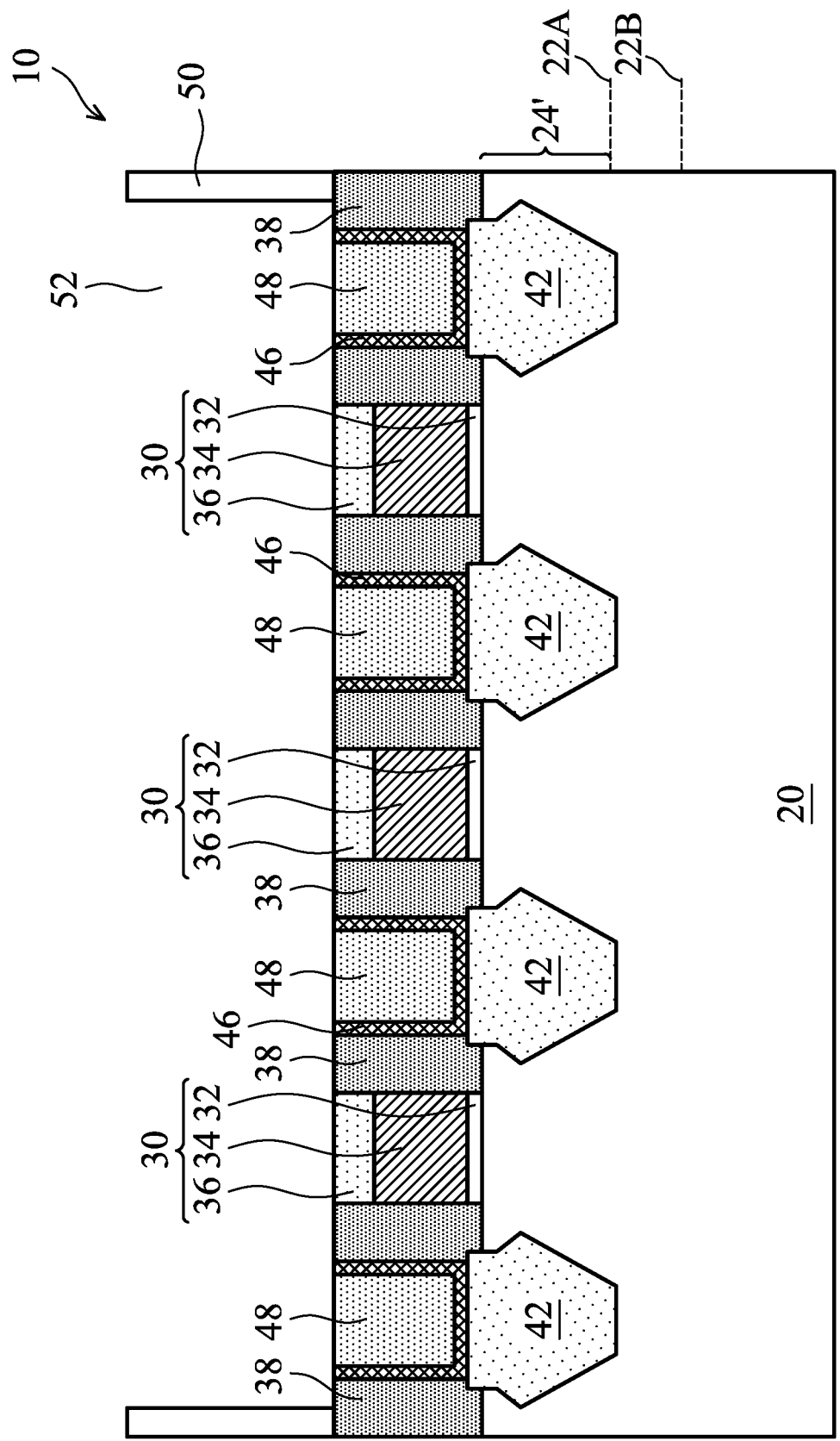

FIG. 6C illustrates a cross-sectional view of the structure shown in FIG. 6B. The illustrated cross-sectional view as shown in FIG. 6C is obtained from the vertical plane containing line 6C-6C in FIG. 6B. FIG. 6D illustrates a cross-sectional view of the structure shown in FIG. 6B. The illustrated cross-sectional view as shown in FIG. 6D is obtained from the vertical plane containing line 6D-6D in FIG. 6B. In FIGS. 6C and 6D and subsequent figures, line 22A represents the level of the top surfaces of STI regions 22, and line 22B represents the level of the bottom surfaces of STI regions 22. STI regions 22 will be at the level between lines 22A and 22B.

Figure 7A:
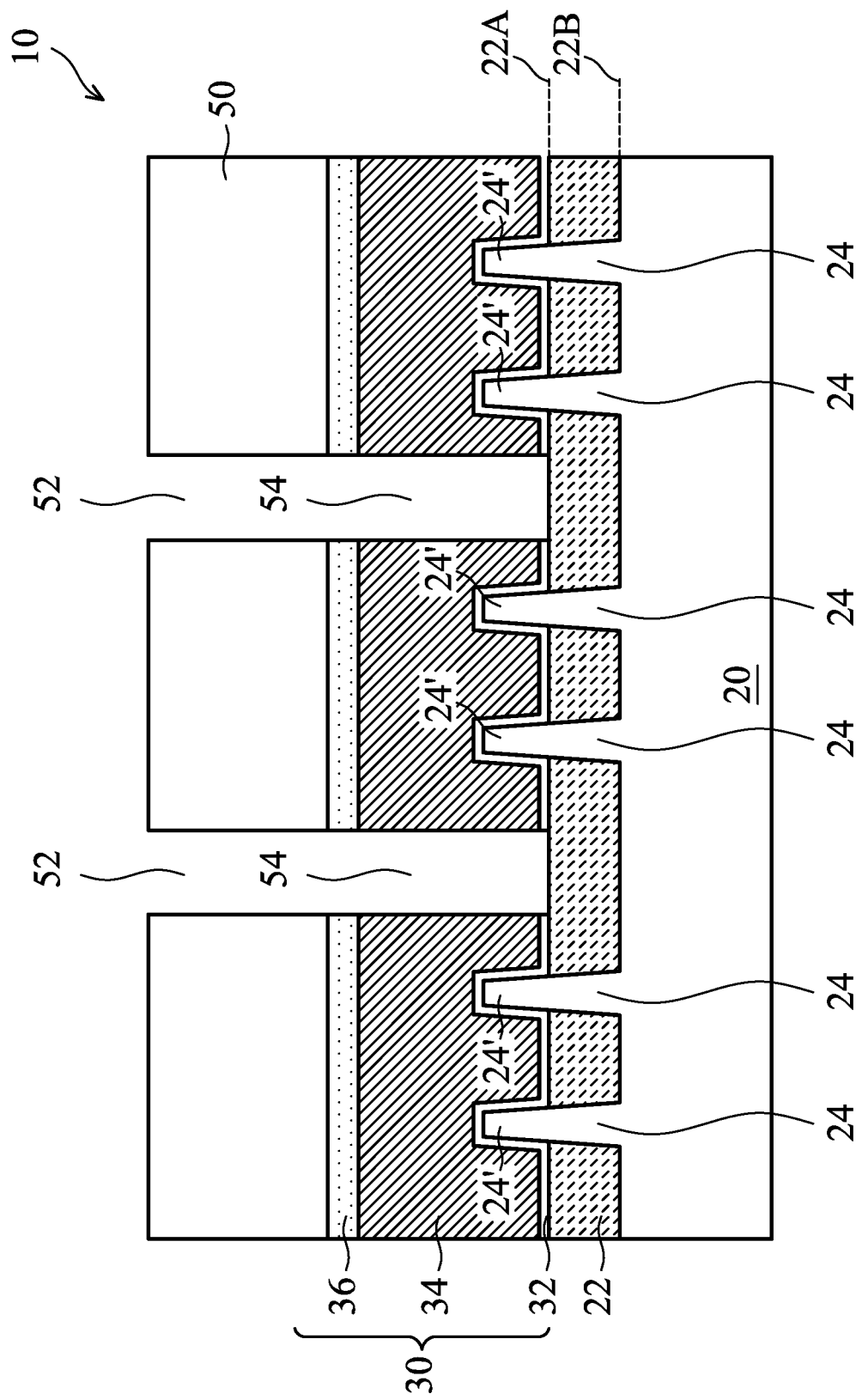
Figure 7B:
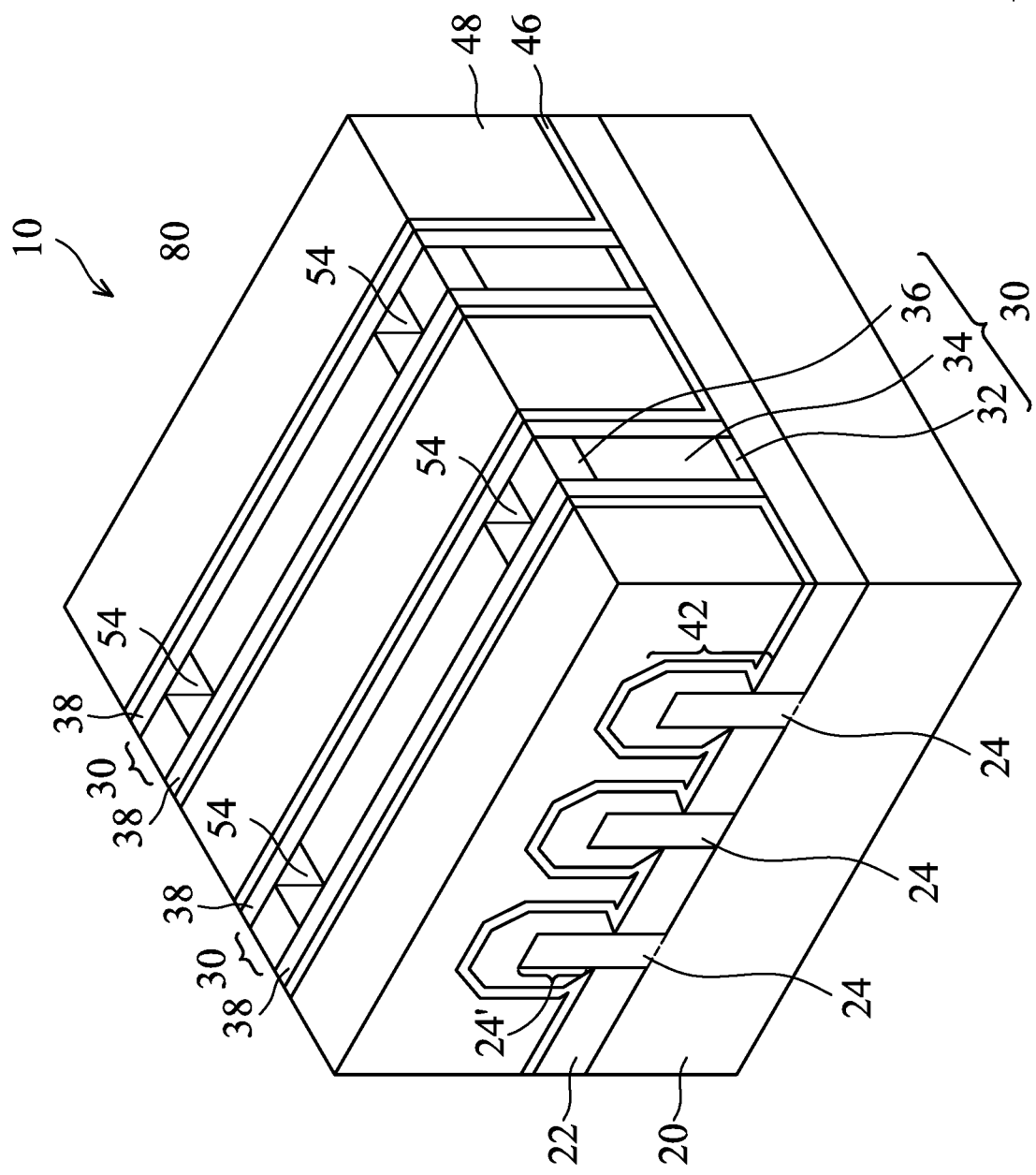

Next, masking layer 50 is used as an etching mask to etch the underlying dummy gate stacks 30. Openings 54 are thus formed in dummy gate stacks 30, as shown in FIG. 7A, which is obtained from the same plane as FIG. 6C. In the etching process, hard mask 36 and dummy gate 6 are etched. The etching is anisotropic, and may stop on the top surface of dummy gate dielectric 32 or the top surface of STI regions 22. Openings 54 are formed between neighboring protruding fins 24'. After the etching process, masking layer 50 is removed. FIG. 7B illustrates a perspective view of wafer 10, which shows the formation of openings 54. In the etching process, gate spacers 38 and ILD 48 are not etched. Accordingly, openings 54 may be limited in the regions between gate spacers 38.

Figure 8:
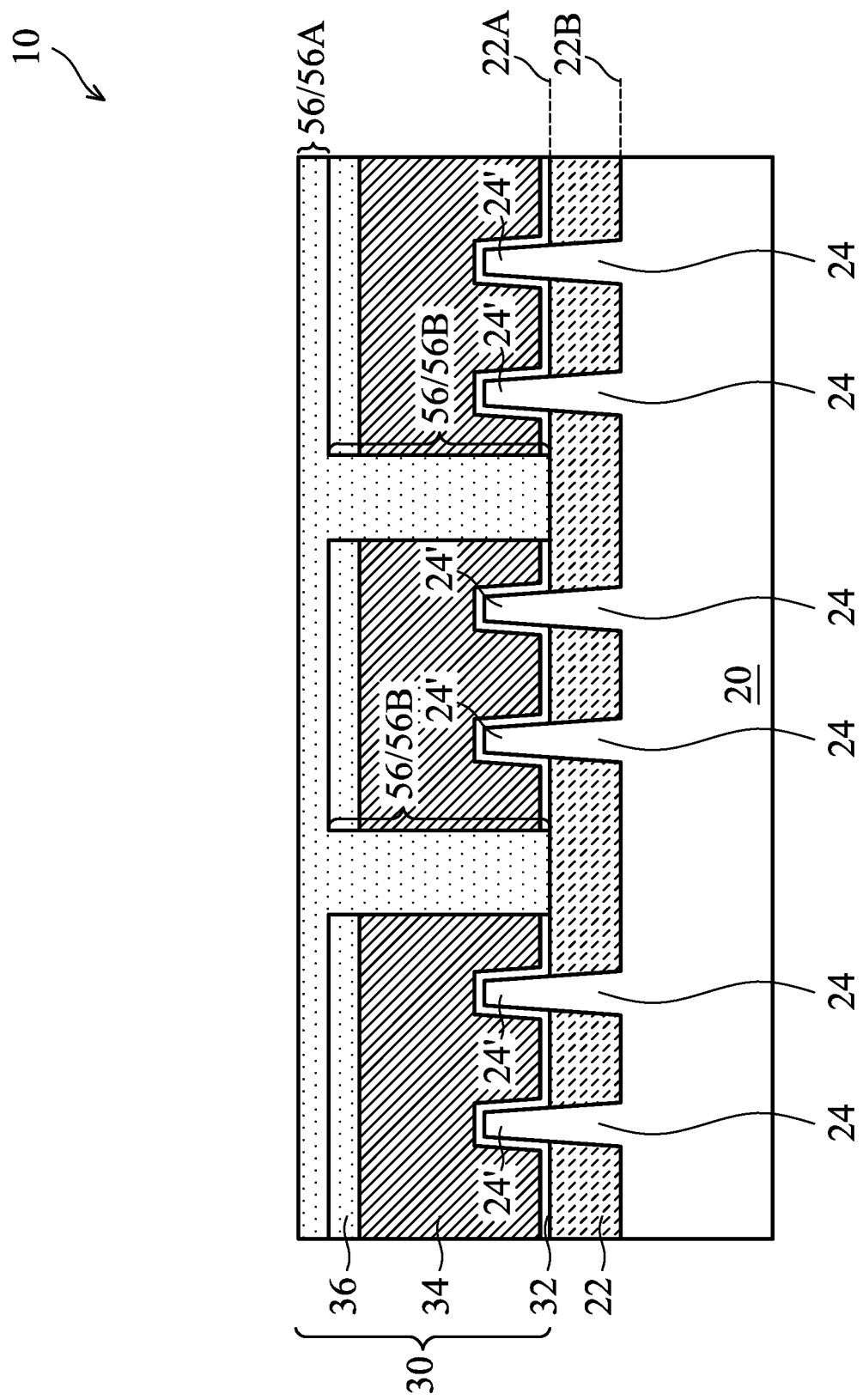
Figure 9A:
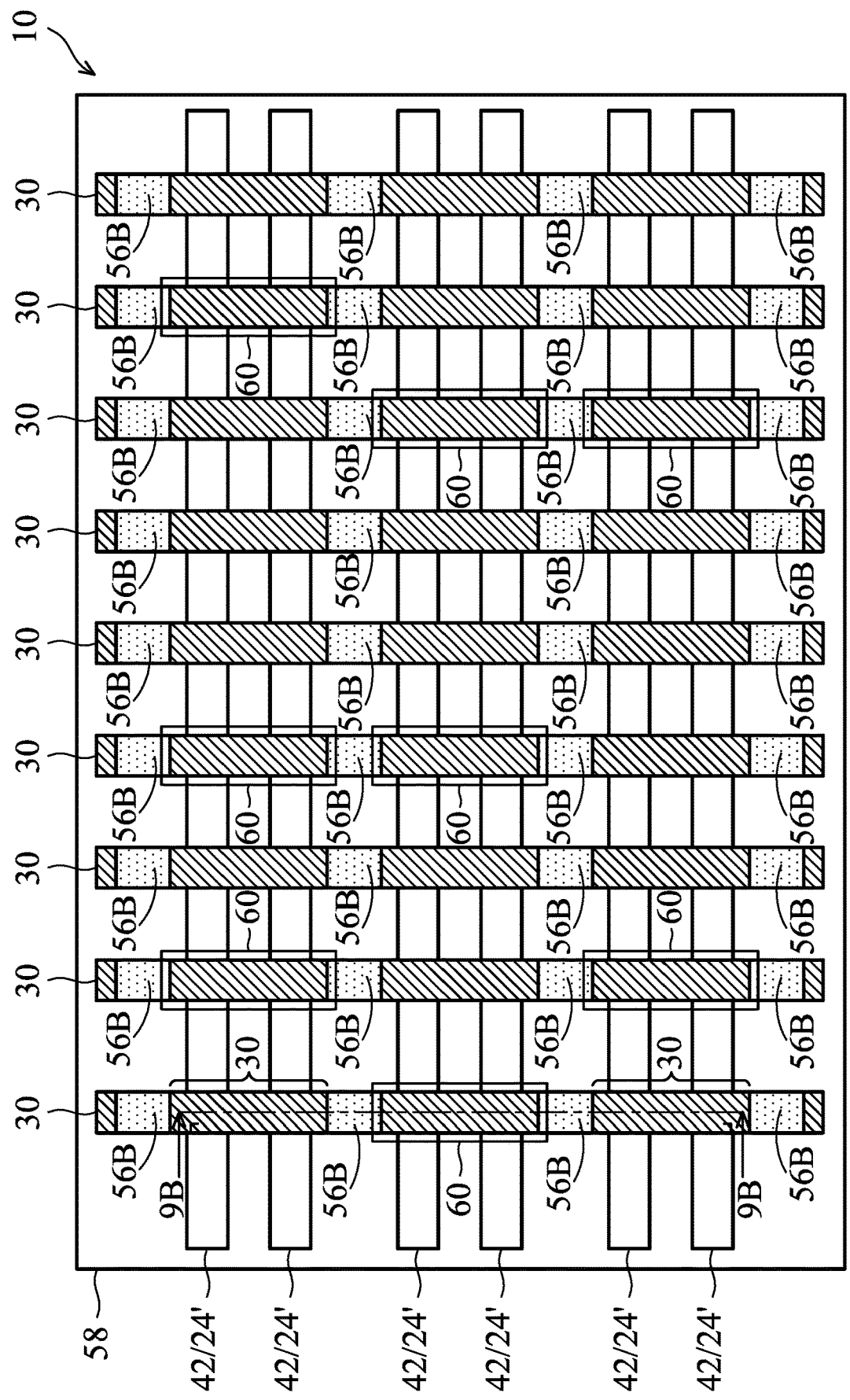

In a subsequent process, dielectric layer 56 is deposited, as shown in FIG. 8, which is also obtained from the same plane as FIG. 6C. Dielectric layer 56 includes some portions extending into openings 54 (FIGS. 7A and 7B) to form isolation regions, and some horizontal portions over the top surfaces of hard mask 36, ILD 48, and gate spacers 38 (shown in FIG. 7B). The respective process is illustrated as process 212 in the process flow 200 as shown in FIG. 18. In accordance with some embodiments, dielectric layer 56 is formed of silicon nitride. In accordance with alternative embodiments, dielectric layer 56 is formed of silicon oxide, silicon carbo-nitride, silicon oxy-carbide, silicon oxy-carbo-nitride, or the like. In accordance with some embodiments of the present disclosure, dielectric layer 56 is formed using Atomic Layer Deposition (ALD). In accordance with other embodiments of the present disclosure, dielectric layer 56 is formed using Chemical Vapor Deposition (CVD).

Figure 14:
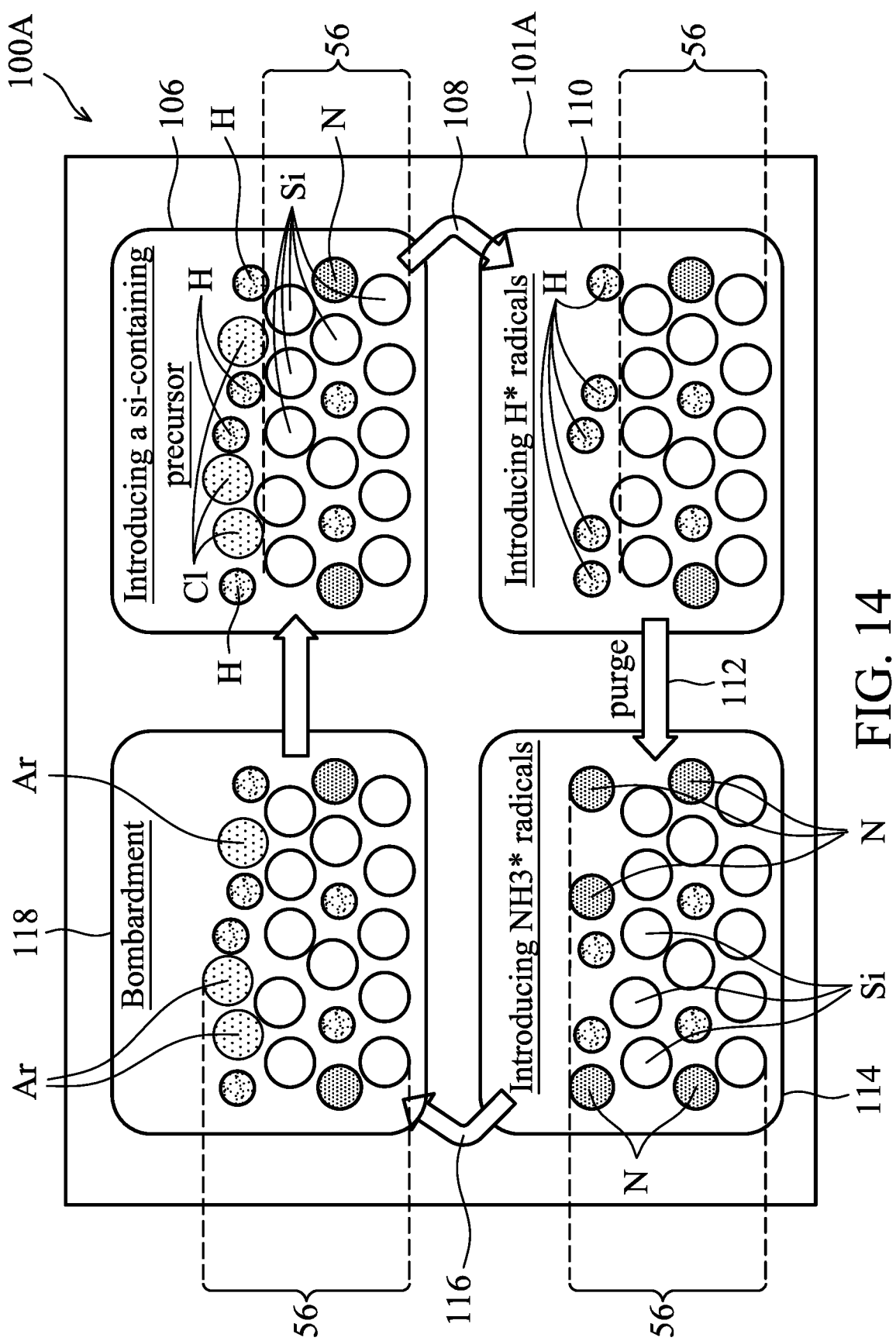
FIGS. 14 and 15 illustrate Atomic Layer Deposition (ALD) cycles in the formation of silicon nitride layers in accordance with some embodiments.

FIG. 14 illustrates process 100A for forming silicon nitride layer 56 (FIG. 8) through ALD in accordance with some embodiments of the present disclosure. Process 100A is performed in process chamber 101A through a plurality of ALD cycles, each forming an atomic layer of silicon nitride layer 56. Block 106 represents the step of introducing a silicon-containing precursor into process chamber 101A. The silicon-containing precursor may include silicon and possibly a halogen element such as chlorine, fluorine, bromine, and/or iodine. In accordance with some embodiments of the present disclosure, the silicon-containing precursor includes DiChloroSilane (DCS, $SiH_2Cl_2$). When an ALD cycle is performed, there may already be silicon nitride layer 56 on wafer 10 formed in previous cycles, and the newly formed silicon nitride layer will be formed on top of the existing layer. The elements at the surface of the underlying silicon nitride layer 56 include silicon (Si), hydrogen (H), chlorine (Cl), and nitrogen (N) in some embodiments. The elements are illustrated schematically in FIG. 14.

Next, referring to the arrow 108, which represents the purge of process chamber 101A, for example, using nitrogen ($N_2$) as a purge gas. After the purge, hydrogen (H) radicals, which is illustrated as H*, are introduced into the process chamber, as shown as step 110 in FIG. 14. During this step, no silicon-containing process gas and silicon radicals are introduced into process chamber 101A, and no nitrogen-containing process gas and nitrogen radicals are introduced into process chamber 101A. H* radicals may be generated through remote plasma, in which a plasma is generated using $H_2$ gas as a process gas. The plasma is generated remotely from the process gas in a tool away from process chamber 101A, and the resulting plasma is filtered to remove ions, and only radicals that are neither negatively charged nor positively charged are left and are introduced into the process chamber. The H* radicals, being activated, are easy to react with other molecules. The H* radicals react with the hydrogen atoms in the attached DCS and the underlying silicon nitride film to form $H_2$, which is removed from process chamber 101A. During the reaction, the respective wafer 10 (FIG. 1) is heated, for example, to a temperature in the range between about 350° C. and about 550° C. The temperature may also be in the range between about 350° C. and about 450° C.

Next, referring again to FIG. 14, process chamber 101A is purged, as represented by arrow 112. The purge may be performed using nitrogen ($N_2$) as a purge gas. After the purge, a nitrogen-containing process gas is introduced, as represented by block 114. The nitrogen-containing process gas may include ammonia ($NH_3$), which may also be in the form of $NH_3$* radicals. The $NH_3$* radicals may be generated through remote plasma, which is generated remotely in a tool away from process chamber 101A. The plasma is filtered to removed charged ions and molecules, leaving radicals such as the $NH_3$* radicals. The radicals are then conducted into process chamber 101A. The $NH_3$* radicals react with Si—H bonds to break the bonds between silicon and hydrogen, and hence Si—N bonds are generated, resulting in an atomic layer of silicon nitride.

After the introduction of $NH_3$* radicals, process chamber 101A is purged, for example, using nitrogen ($N_2$) as a purge gas. The purge is represented by arrow 116. One ALD cycle for forming one layer of silicon nitride is thus finished. Another ALD cycle may be started. The deposition of silicon nitride layer 56 (FIG. 8) may include a plurality of ALD cycles as illustrated in FIG. 14.

In accordance with some embodiments of the present disclosure, after each ALD cycle, a bombardment (step 118) is performed. The bombardment may be performed using Ar or nitrogen, and argon or nitrogen is introduced into silicon nitride layer 56. Since the newly formed silicon nitride layer 56 is thin, which may be one atomic layer of silicon nitride, the bombardment energy can be set low while still being effective. In accordance with some embodiments of the present disclosure, the bombardment is performed using an energy lower than about 10 keV, which may be between about 1 keV and about 5 keV.

In accordance with alternative embodiments of the present disclosure, the introduction of H* radicals, rather being introduced after step 106 and before step 114, may also be conducted into the process chamber after step 114 and before 106. Also, the bombardment step 118, rather than being performed after step 114 and before step 106, may also be performed between steps 106 and 110, or between steps 110 and 114.

In accordance with some embodiments, instead of conducting H* radicals into process chamber in each of the ALD cycles, the H* radicals may be conducted once every N cycles, wherein number N may be 2, 3, 4, or any number greater than 4. Also, the bombardment may also be performed following each of the ALD cycles, or conducted once every M cycles, wherein number M may be 2, 3, 4, or any number greater than 4. Furthermore, either one, or both, of the conduction of H* radicals and the bombardment may be conducted in/after any of the ALD cycles.

Silicon nitride layer 56 (FIG. 8), if formed without the hydrogen radical treatment and the bombardment, tends to have a higher tensile stress, for example, with a magnitude greater than about 1 GPA. The conduction of H* radicals results in the reduction of hydrogens from silicon nitride layer 56, which causes the stress in silicon nitride layer 56 to change in the direction from tensile to compressive. Alternatively stated, stress may be changed from high tensile stress toward neutral stress, and from neutral stress toward compressive stress. In the bombardment, silicon nitride layer 56 is compacted. Further, the bombarded species (such as Ar atoms or nitrogen atoms) are inserted into silicon nitride layer 56. Accordingly, the bombardment also has the effect of changing the stress in silicon nitride layer 56 from tensile to neutral (and toward compressive). In accordance some embodiments of the present disclosure, the process conditions such as the number N (as discussed in preceding paragraphs), the bombardment energy, etc, are adjusted to make silicon nitride layer 56 to have a stress as close to zero stress as possible, for example, to a neutral stress (which may be a tensile or compressive stress with the magnitude of the stress being smaller than about 0.2 GPa), or substantially neutral stress (which may be a tensile or compressive stress with the magnitude of the stress being smaller than about 0.2 GPa).

In accordance with alternative embodiments of the present disclosure, dielectric layer 56 is formed using other deposition methods such as CVD. In accordance with some embodiments of the present disclosure, the formation of dielectric layer 56 includes a plurality of cycles, each including depositing a sub-layer of dielectric layer 56, stopping the deposition, and then performing bombardment on the deposited sub-layer. The deposited sub-layer is thin in order to maximize the effect of the bombardment and to reduce bombardment energy (so that the damage to other features may be reduced). For example, the bombardment may be performed after the deposition of every several nanometers (1 to 5 nanometers, for example). The cycle of deposition and bombardment is repeated until dielectric layer 56 reaches the desirable thickness. When CVD is used, dielectric layer 56 may be formed of silicon nitride or other dielectric materials other than silicon nitride.

In accordance with some embodiments, to achieve neutral stress for silicon nitride layer 56, experiments are performed to find optimum process conditions for forming dielectric (silicon nitride) layer 56. For example, a plurality of sample wafers may be formed, with the structures of the sample wafers being the same as the production wafer as in FIG. 8. The formation of the silicon nitride layers in the sample wafers is performed using different combinations of process conditions. For example, the process conditions include the number of hydrogen radical treatments and/or implantations performed for a certain number of ALD cycles (such as every 100 ALD cycles), the implantation species, the implantation energy, etc. The optimum process conditions for forming the silicon nitride layer is determined as the process conditions corresponding to a silicon nitride layer having as close to zero stress as possible. The optimum process conditions may then be used to manufacture production wafers such as what is shown in FIG. 8.

Referring back to FIG. 8, dielectric layer 56 includes portions extending into openings 54 (FIG. 7A) in dummy gate stacks 30 to form dielectric plugs 56B (also referred to as isolation regions), and horizontal portions 56A on the top surfaces of dummy gate stacks 30. The top view of the structure shown in FIG. 8 may also be found in FIG. 9A. In FIG. 9A, dielectric plugs 56B are illustrated, while the horizontal portions 56A (FIG. 8) are not shown, and the horizontal portions exist at this stage to cover the entire wafer 10. Dielectric plugs 56B isolate the previously formed long dummy gate stacks 30 into shorter portions.

Figure 9B:
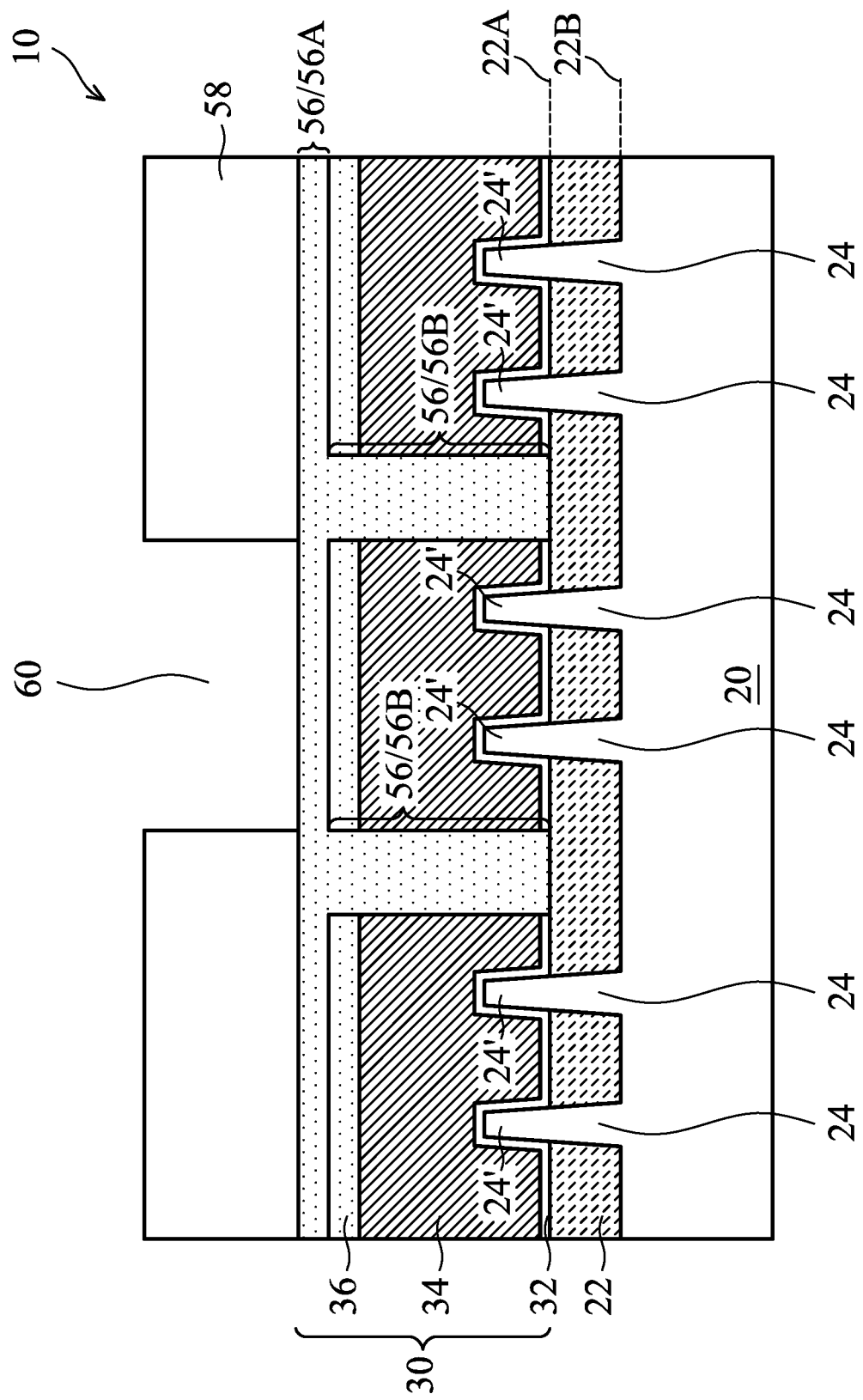

Next, as shown in FIGS. 9A and 9B, photo resist 58 is formed to cover wafer 10, followed by patterning photo resist 58 to form openings 60. Each of openings 60 is formed to reveal a portion of dummy gate stack 30 between two neighboring dielectric plugs 56B. The edge portions of dielectric plugs 56B may also be exposed to provide some process margin. FIG. 9B illustrates the cross-sectional view of the structure shown in FIG. 9A, wherein the cross-sectional view is obtained from the plane containing line 9B-9B in FIG. 9A.

Figure 10:
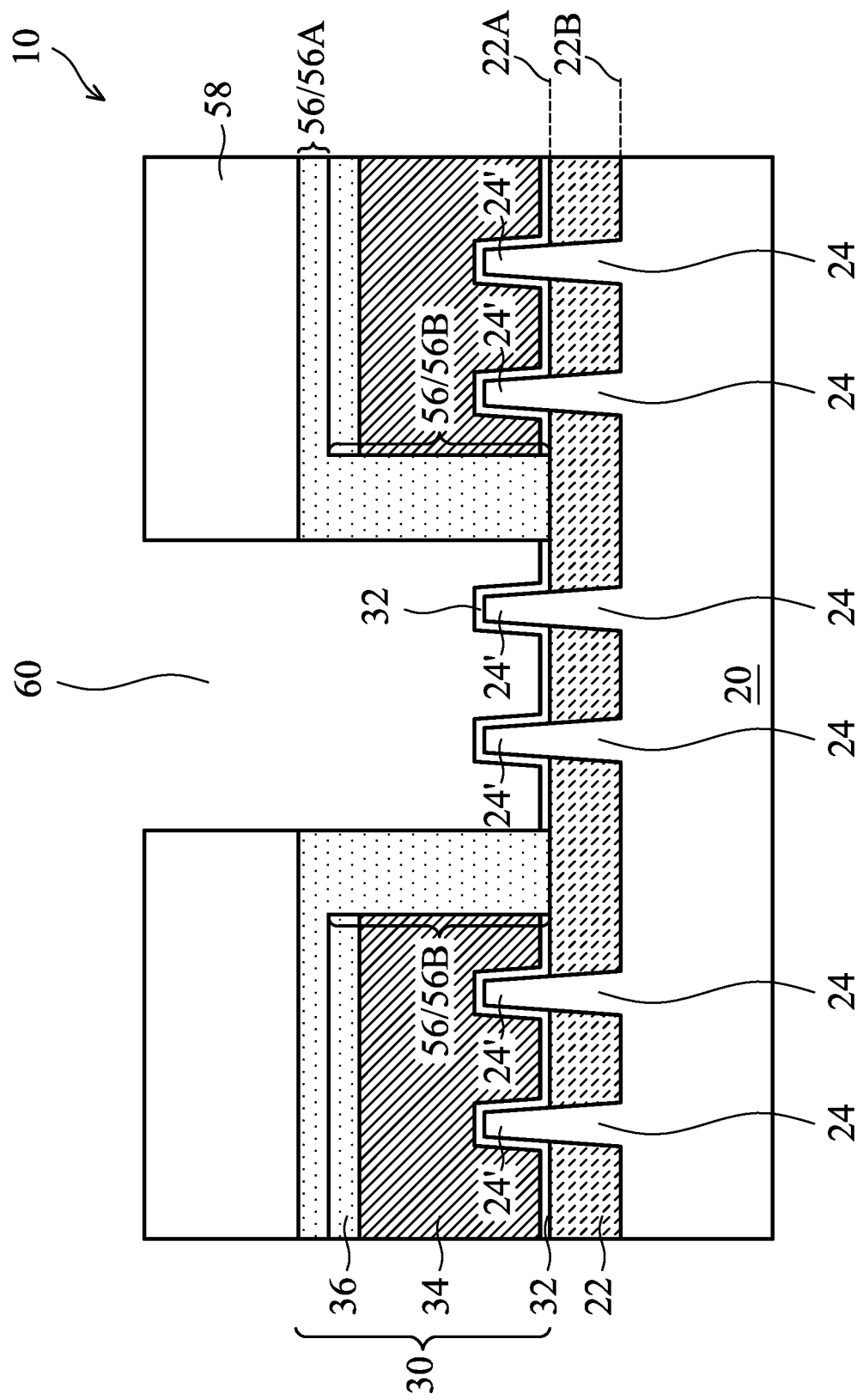
Figure 11A:
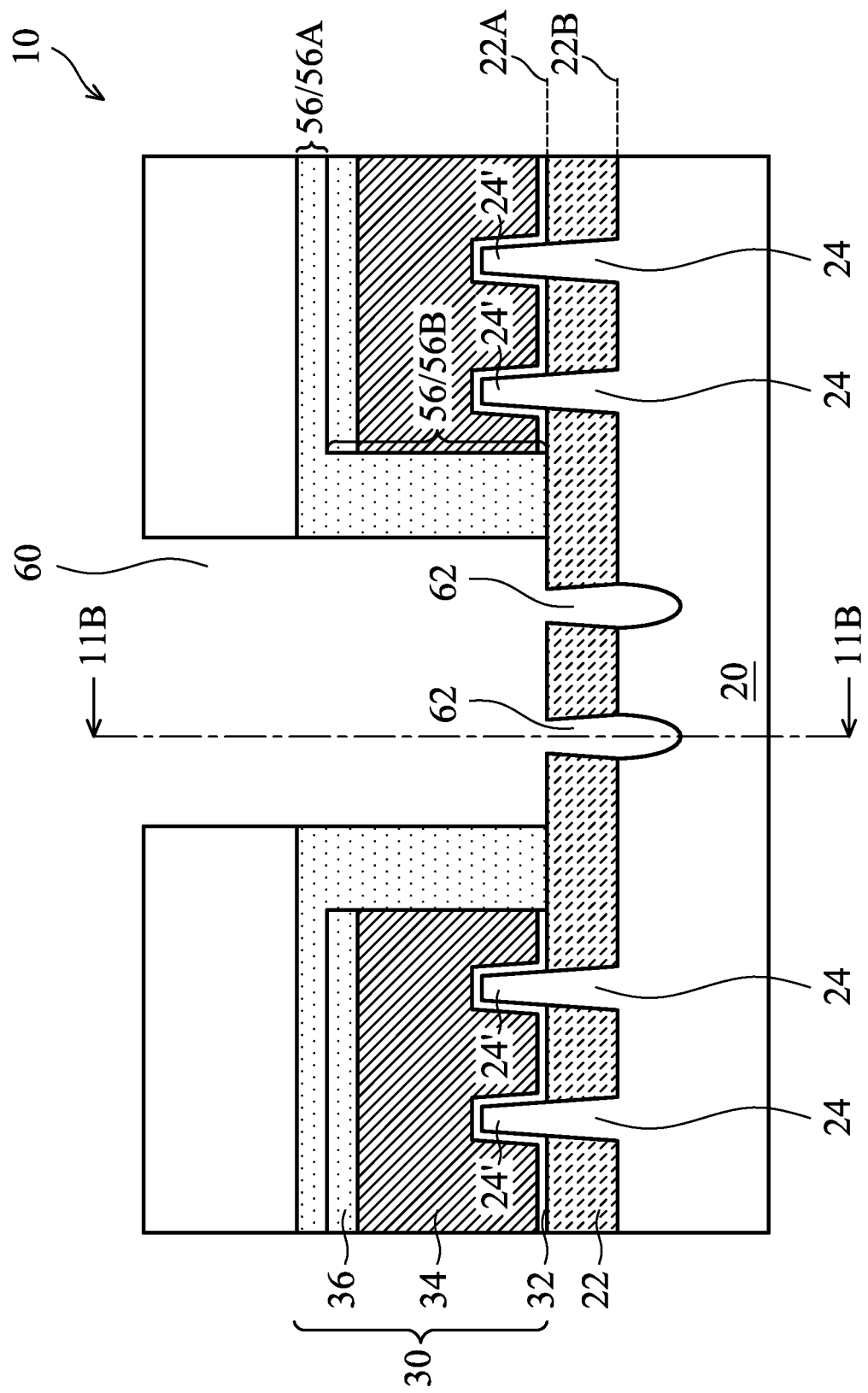

The photo resist 58 as shown in FIG. 9B is then used as an etching mask to etch the underlying dielectric layer 56, hard mask 36, and dummy gate electrode 34, so that opening 60 extends into dummy gate stack 30 to form a trench, which is also referred to as trench 60. The respective process is illustrated as process 214 in the process flow 200 as shown in FIG. 18. As a result, the structure shown in FIG. 10 is formed. Next, dummy gate dielectric 32 is etched, so that protruding fins 24' are exposed. The process gas is then changed to etch protruding fins 24'. The respective process is illustrated as process 216 in the process flow 200 as shown in FIG. 18. After the protruding fins 24' are removed, the underlying semiconductor strips 24, which are between opposite portions of STI regions 22, are also etched, resulting in trenches 62. The resulting structure is shown in FIG. 11A. The etch may be performed until the resulting trenches 62 have bottoms lower than the bottom surfaces 22B of STI regions 22. Accordingly, trenches 62 extend into the bulk portion of substrate 20 underlying STI regions 22.

Figure 11B:
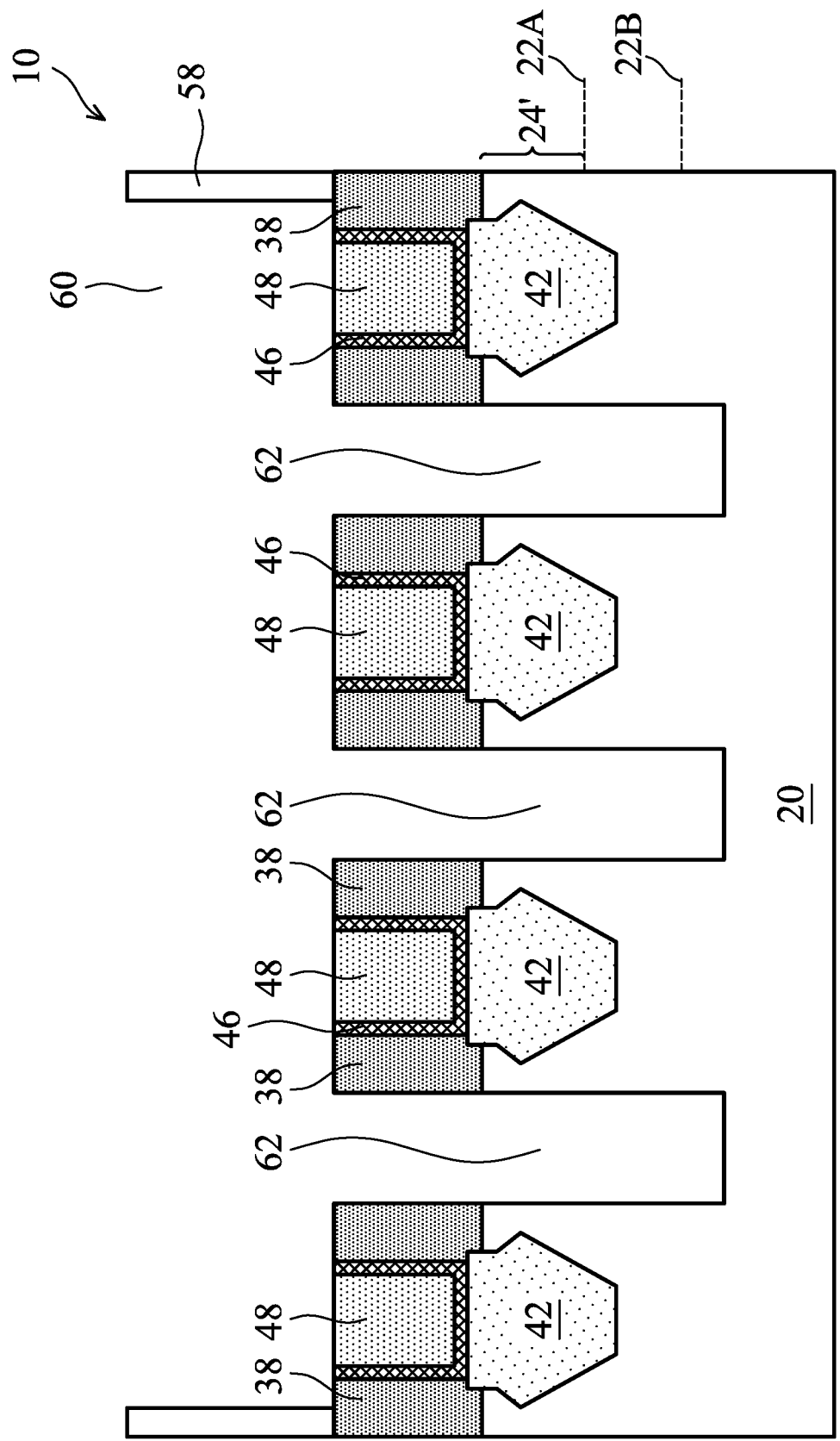

FIG. 11B illustrates a cross-sectional view of the structure shown in FIG. 11A, and the cross-sectional view is obtained from the vertical plane containing line 11B-11B as shown in FIG. 11A.

Figure 12A:
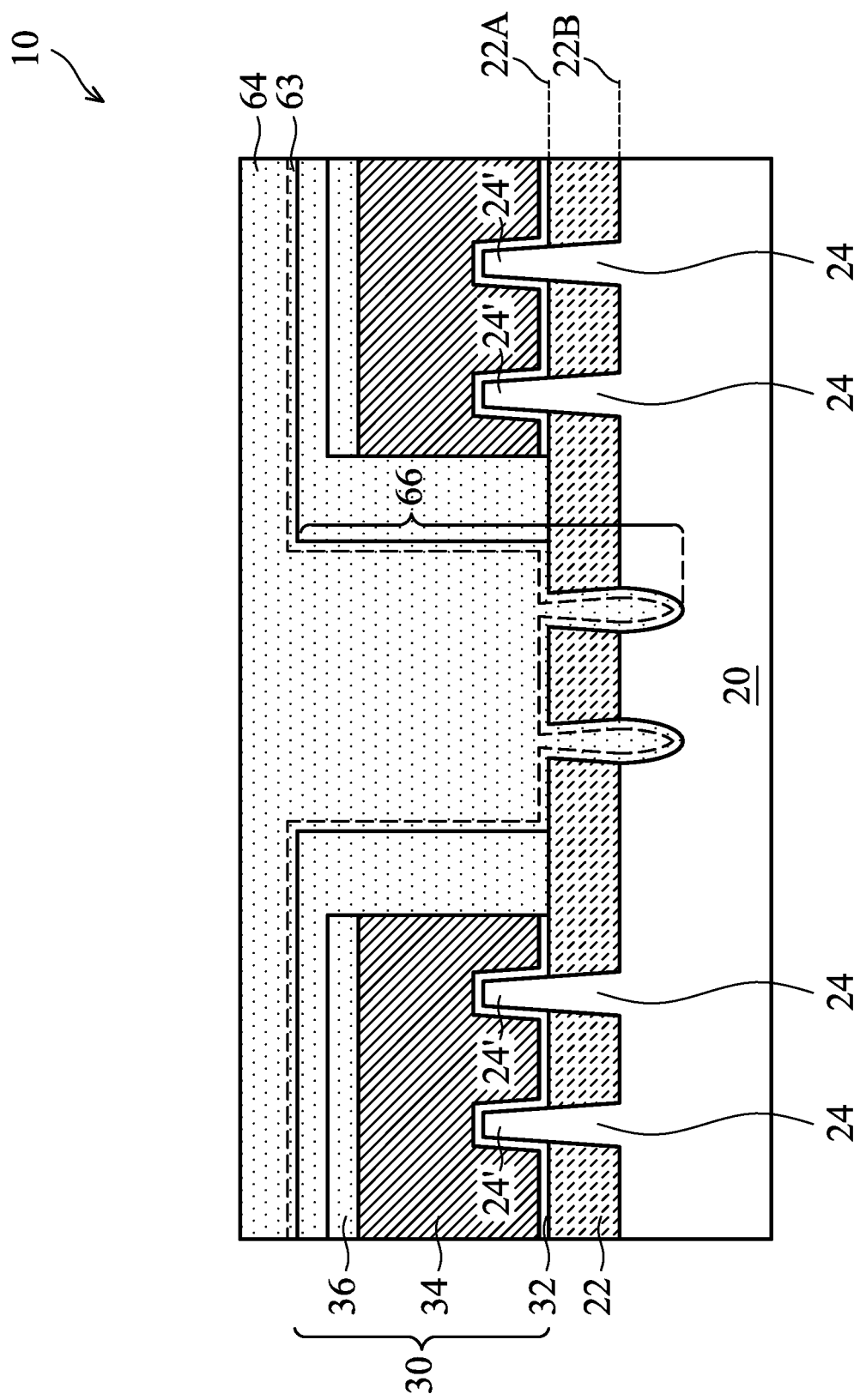
Figure 12B:
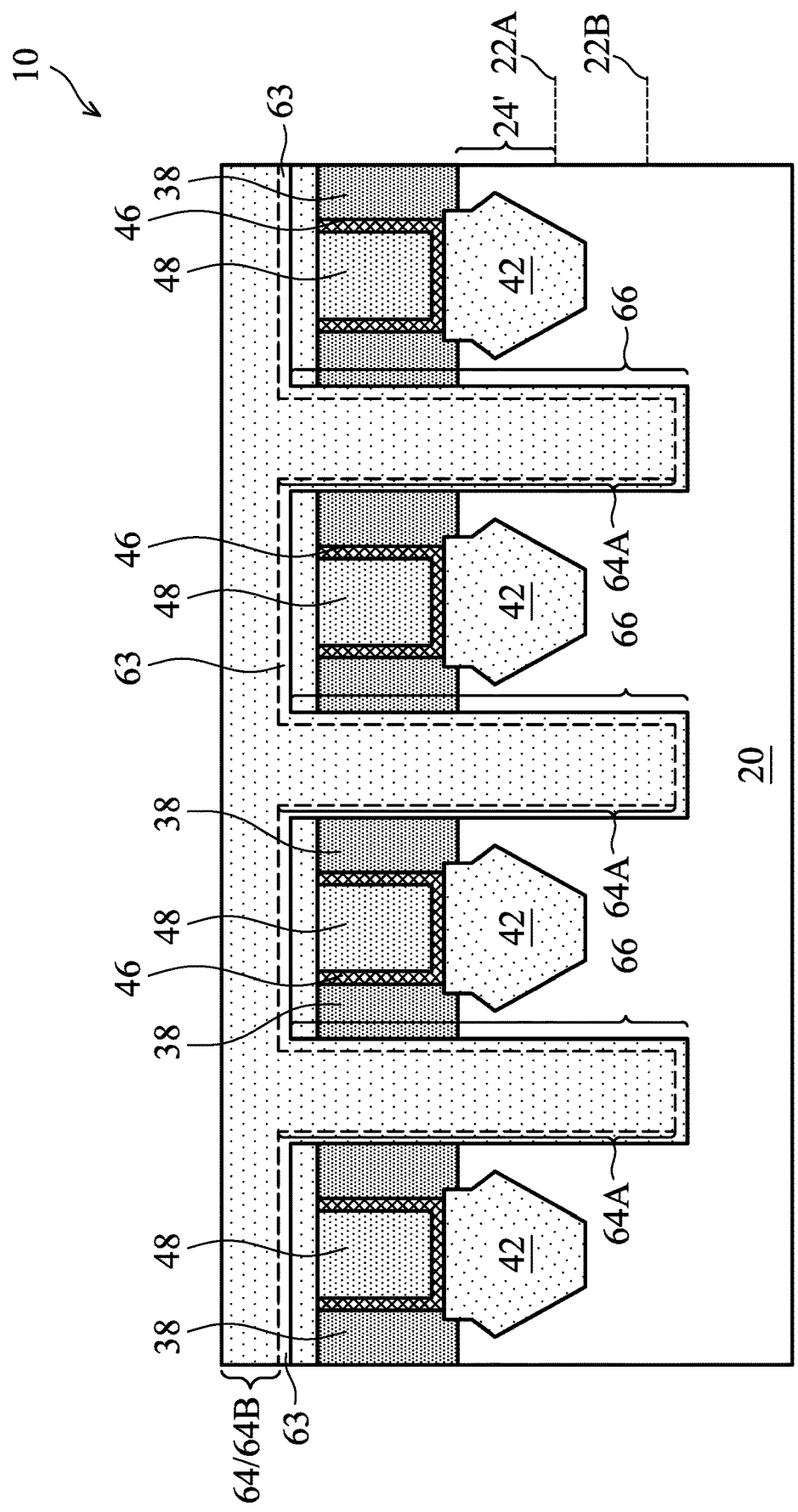
Figure 12C:
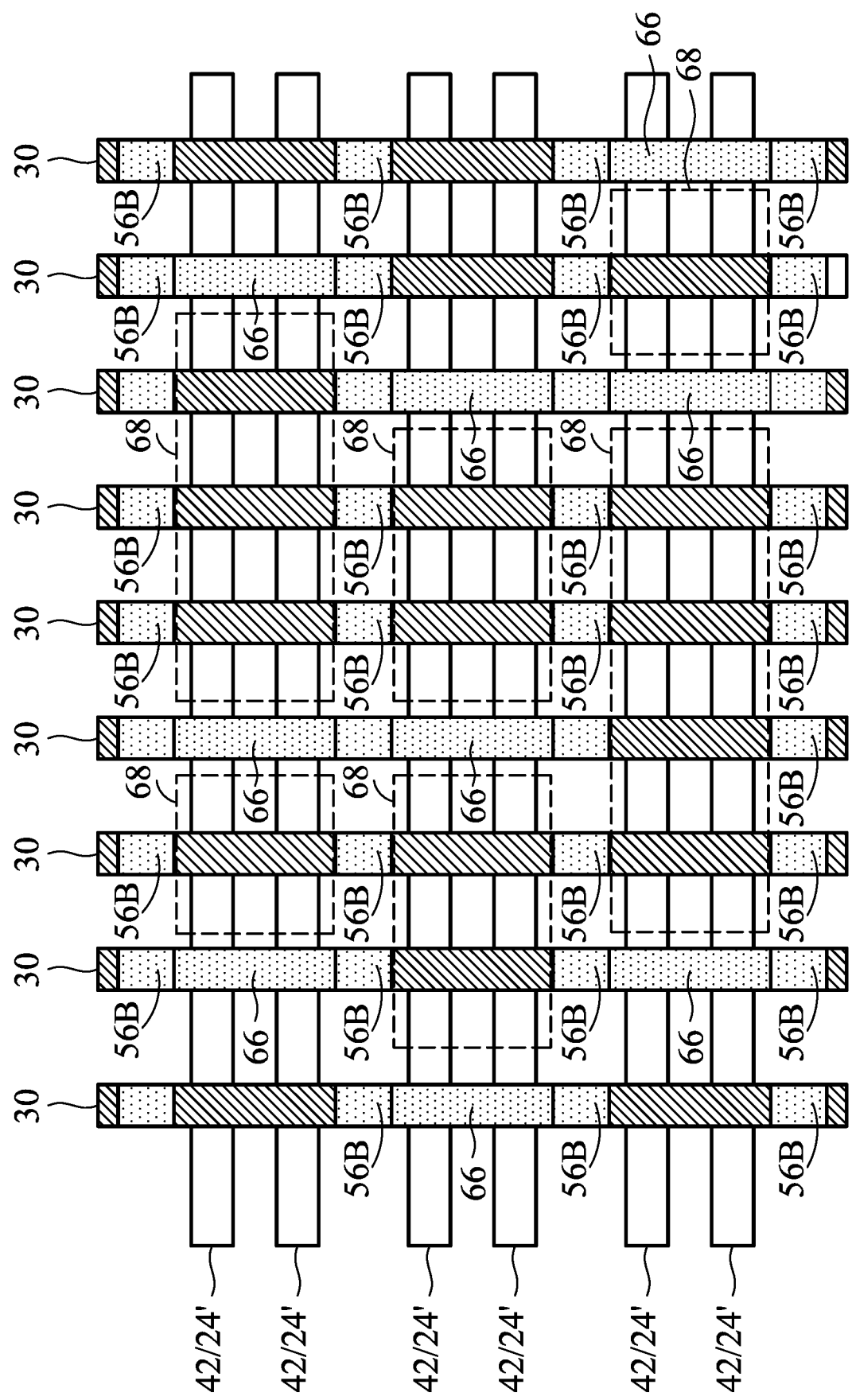

The remaining portions of trenches 60 and 62 as shown in FIGS. 11A and 11B are then filled with dielectric materials to form isolation regions, as shown in FIGS. 12A, 12B, and 12C. The respective process is illustrated as process 218 in the process flow 200 as shown in FIG. 18. In accordance with some embodiments, liner dielectric layer 63 is formed, as shown in FIGS. 12A and 12B. Liner dielectric layer 63 may be formed of silicon oxide, for example. In accordance with some embodiments of the present disclosure, liner dielectric layer 63 is formed using a deposition method such as CVD or ALD. Accordingly, liner dielectric layer 63 is formed as a conformal layer. In accordance with some embodiments of the present disclosure, liner dielectric layer 63 is formed through thermal oxidation, and liner dielectric layer 63 is formed on the exposed surface of substrate 20, and not on dielectric layers such as STI regions 22 and dielectric layer 56. In accordance with alternative embodiments, the formation of liner dielectric layer 63 is skipped, and the subsequently formed dielectric layer 64 contacts substrate 20.

Dielectric layer 64 is formed to fill the remaining portions of trenches 60 and 62 (FIGS. 11A and 11B). Dielectric layer 64 may be formed of any material selected from the candidate materials for forming dielectric layer 56. Furthermore, the formation process may be selected from any candidate process for forming dielectric layer 56. For example, the process 100A as shown in FIG. 14 may be used for forming dielectric layer 64. The details of the materials and the formation processes for forming dielectric layer 64 are thus not repeated herein.

Dielectric layer 64 and liner dielectric layer 63 in combination include portions 64A extending into openings 60 and 62 (FIGS. 11A and 11B) to form dielectric plugs 66, which are also referred to as isolation regions. Dielectric layer 64 further includes horizontal portions 64B overlapping dummy gate stack 30. FIG. 12C illustrates a top view of the structure shown in FIGS. 12A and 12B. In FIG. 12C, the horizontal portions of dielectric layers 64 and 56 are not shown, while the horizontal portions exist at this time. The dielectric plugs 56B and 66 are illustrated.

As shown in FIG. 12C, dielectric plugs 56B divide long dummy gate stacks 30 into shorter portions. The formation of dielectric plugs 56B is referred to as a cut-poly process. The formation of dielectric plugs 66 results in the otherwise long semiconductor regions, which include source/drain regions 42 and protruding fins 24', to be cut into shorter portions. The formation of dielectric plugs 66 is referred to as a cut-PODE process. Accordingly, the short dummy gate stacks 30 and the short semiconductor region are used as the dummy gate stacks and the source/drain and channels of FinFETs. For example, FIG. 12C illustrates a plurality of FinFET regions 68, inside each one FinFET can be formed. It is appreciated by selecting the positions of regions 56B and 66, FinFET with different number of gates (such as one gate, two gates, three gates, and four gates) may be formed. Also, by adjusting the distances between dielectric plugs 56B, the FinFETs may also have different number of fins as design requires. The FinFETs may be formed by replacing the dummy gate stacks 30 in FinFET regions 68, and forming source/drain silicide regions and gate contact plugs. The details are shown in FIG. 13.

Figure 12D:
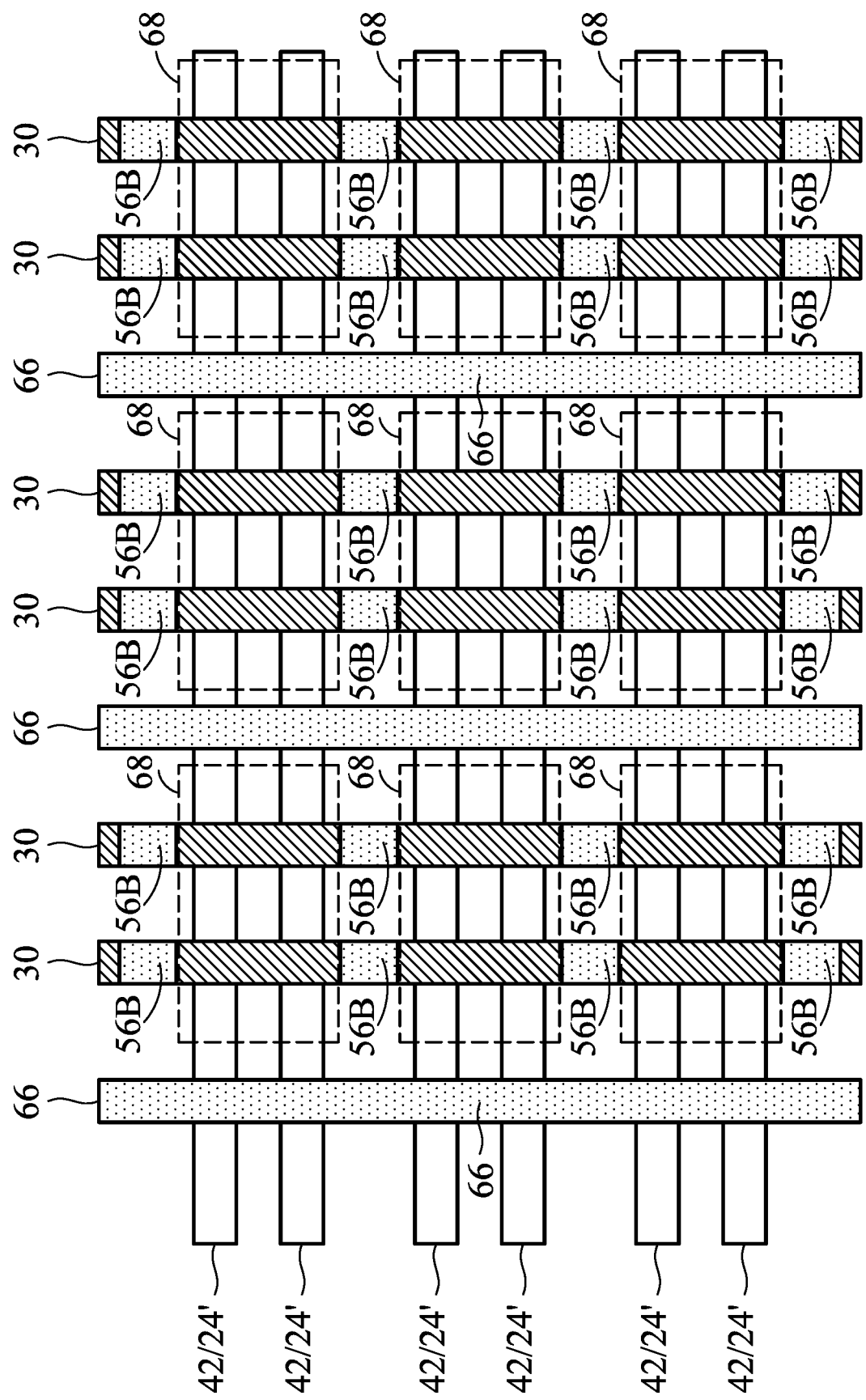

FIG. 12D illustrates a top view of a structure formed using the processes as in preceding paragraphs and figures. These embodiments are similar to the embodiments in FIG. 12C, except the processes shown in FIGS. 6A/6B/6C/6D through 8 may be used to form short dielectric plugs 56B on a first plurality of dummy gate stacks 30, but not on a second plurality of dummy gate stacks 30. The second plurality of dummy gate stacks are replaced entirely with long dielectric plugs 66. In accordance with other embodiments, the processes shown in FIGS. 6A/6B/6C/6D through 8 are skipped, and both dielectric plugs 56B and 66 are formed simultaneously in the same processes as shown in FIGS. 9A/9B through FIGS. 12A/12B/12C/12D.

Figure 13:
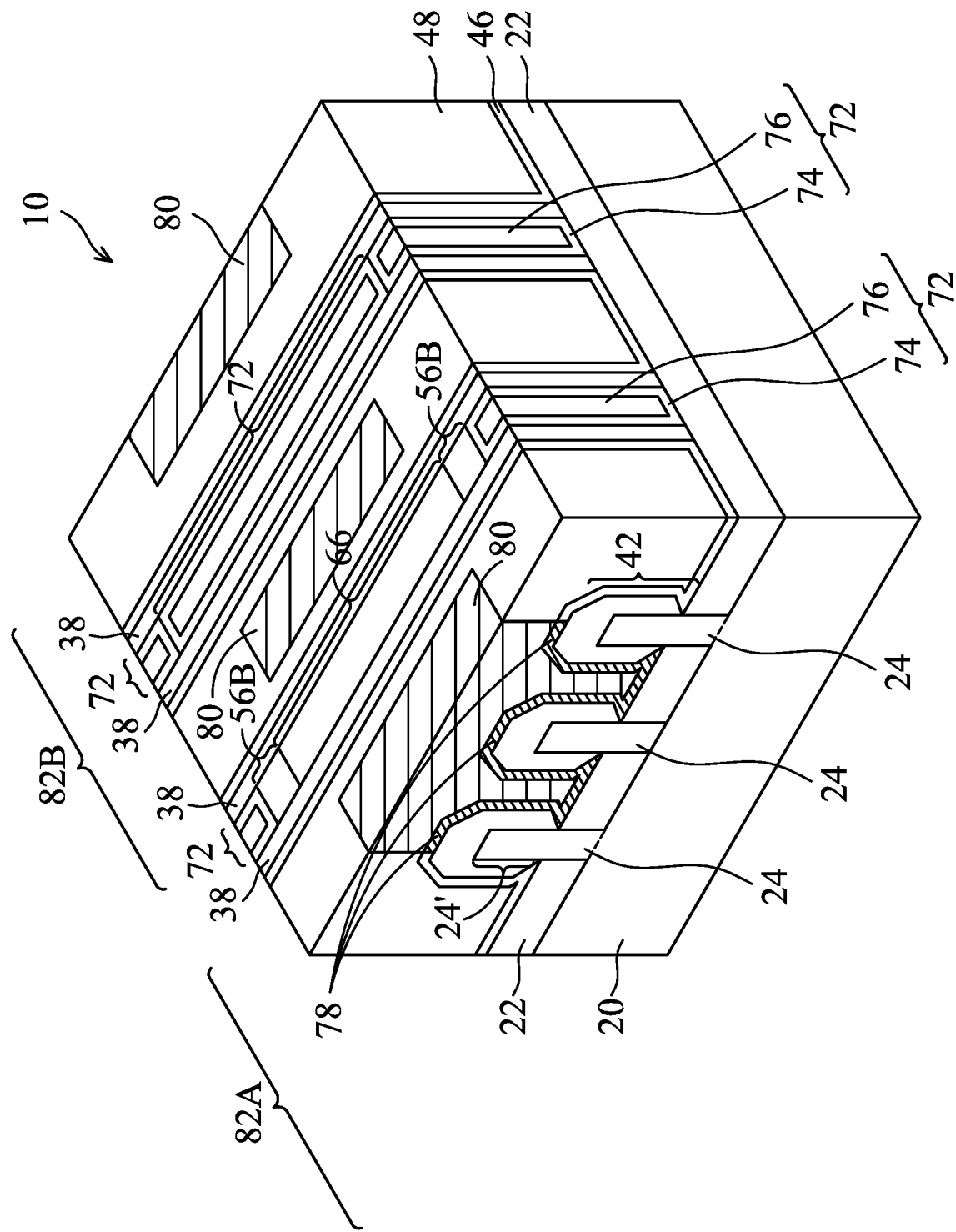

FIG. 13 illustrates the formation of replacement gates 72. The respective process is illustrated as process 220 in the process flow 200 as shown in FIG. 18. The formation process includes performing a planarization to remove the horizontal portions of dielectric layers 56 and 64 in FIGS. 12A and 12B to expose dummy gate stacks 30, removing the remaining portions of dummy gate stacks 30 (FIG. 12C) to form trenches, and forming replacement gates 72 in the resulting trenches. Replacement gates 72 include gate dielectrics 74 and metal gate electrodes 76. Isolation regions 56B and 66 separate the replacement gates 72.

Also referring to FIG. 13, some portions of ILD 48 and CESL 46 are removed to form contact openings, followed by siliciding the exposed portions of source/drain regions 42 to form source/drain silicide regions 78, and filling a conductive material such as tungsten to form source/drain contact plugs 80. FinFETs (including 82A and 82B) are thus formed. For example, in FIG. 13, FinFET 82A is on the left side of isolation region 66, and FinFET 82B is on the right side of isolation region 66. FinFET 82A has one source/drain shown, and the replacement and the other source/drain region are not illustrated, while they still exist.

In the illustrated examples as shown in FIG. 12C, protruding fins 24' are cut every three dummy gate stacks 30 to form isolation regions 66. Depending on the requirements of circuits, some protruding fins 24' may be cut every two dummy gate stacks 30, so that the resulting FinFETs are single-gate FinFETs. The resulting cut-PODE process is referred to as a dense cut-PODE process. Some other protruding fins 24' on the same wafer and die may be cut every P dummy gate stacks 30, wherein number P may be 4, 5, or any number greater than 5. The resulting cut-PODE process is referred to as an Iso cut-PODE process. In the dense cut-PODE process, the distance between neighboring isolation regions 66 is small. In the iso cut-PODE process, the distance between neighboring isolation regions 66 is large. The different distances cause different stresses to be applied to the neighboring FinFETs. For example, in the iso cut-PODE process, since there is a long distance for stress to accumulate, the stress in the horizontal portions of dielectric layers 56 and 64 is greater than the stress in the horizontal portions of dielectric layers 56 and 64 between dense cut-PODEs. The stress received by the FinFETs close to the dense CPODE regions 56/64 is thus smaller than the stress received by the FinFETs close to the iso CPODE regions 56/64. Throughout the description, "dense CPODE regions" refer to the regions in which the CPODE density (the number of fin-cuts per unit chip area in CPODE processes) is relatively high, and "iso CPODE regions" refer to the regions in which the CPODE density is relatively low. It is appreciated that the concepts of "dense" and "iso" are relative, and may change depending on the corresponding circuit design and device requirements. For example, a dense CPODE region may have ten or more gates between two neighboring fin-cuts on average, while an iso CPODE region may have about two to six gates between two neighboring fin-cuts on average. Also, when a ratio of a first CPODE density in a first region is about five times or more of a second CPODE density in a second region, the first region may be consider as a dense CPODE region, and the second region may be considered as an iso CPODE region.

The stress in the horizontal portions of the dielectric layers 56/64 affects the threshold voltage in neighboring FinFETs, causing the drift in the threshold voltages of the FinFETs. For example, if the threshold voltage immediately neighboring no-stress silicon nitride layers have threshold $Vt0$, due to the stress in silicon nitride layers 56 and 64 (FIGS. 12A, 12B, and 12C), the threshold voltages of the neighboring FinFETs may shift to $Vt1$, and the threshold-voltage shift $\Delta Vt$ is equal to $(Vt1-Vt0)$. If silicon nitride layers 56 and 64 are formed using process 100B (FIG. 15, discussed in subsequent paragraphs), the stress in the silicon nitride layers 56 and 64 are high, and the threshold-voltage shift ΔVt (the reduction of threshold-voltage) may reach, for example, about 146 mV. When silicon nitride layers 56 and 64 are formed using process 100A (FIG. 14), the stress in the silicon nitride layers 56 and 64 are low, and the threshold-voltage shift ΔVt is reduced, for example, to about 69 mV (the reduction of threshold-voltage), which is 52.7% reduction. It is desirable to have lower threshold voltage shift. In accordance with some embodiments of the present disclosure, by adopting process 100A to form silicon nitride layers, the threshold voltage shift ΔVt is reduced.

In accordance with some embodiments of the present disclosure, a threshold CPODE density is pre-determined. For example, the threshold CPODE density may be calculated as being the average value of a wafer-edge-region CPODE density and a wafer-center-region CPODE density. The threshold CPODE density may also be defined as other values. Dielectric plugs 66 throughout a die (and a respective wafer) are separated into two groups. The first group includes the dielectric plugs 66 in the regions whose CPODE densities are higher than or equal to the threshold CPODE density, and the second group includes the dielectric plugs 66 in the regions whose CPODE densities are lower than the threshold CPODE density. In accordance with some embodiments, the first group of dielectric plugs 66 is formed using first processes as shown in FIGS. 9A/9B through FIGS. 12A/12B/12C/12D. The first group of dielectric plugs 66 is formed adopting process 100B (FIG. 15) since the first group of dielectric plugs 66 have relatively smaller stress values, and don't have to use process 100A to further reduce stress. On the other hand, the second group of dielectric plugs 66 are formed adopting process 100A (FIG. 14) to reduce their stresses, and the respective processes are also shown in FIGS. 9A/9B through FIGS. 12A/12B/12C/12D.

Due to the stress in CPODE, the distances between the atoms in the dielectric plugs may be changed compare to the distances of atoms when the dielectric regions have neutral stress. For example, in accordance with some experiments performed on real wafers, if process 100B (FIG. 15) is used to form CPODE regions, there is a significant difference between the stresses in different CPODE regions. The stresses may be determined by using nano-beam diffraction (which is a type of Transmission Electron Microscopy (TEM)) to measure the changes in the average distances between atoms because stresses cause the average distances to change. In some experiments, in a dense CPODE region, the average distance between atoms is reduced by about 0.09% due to the stress, and in an iso CPODE region, the average distance between atoms is reduced by about 0.37% due to the stress. Accordingly, there is a significant difference between the stresses in dense CPODE regions and the stresses in iso CPODE regions. As a comparison, when process 100A (FIG. 14) is used to form CPODE regions, the reduction in the average distance between atoms in both the dense and iso CPODE regions are reduced, indicating that stresses are smaller. Experiments indicate that when process 100A is used, all the average distances in dense and iso CPODE regions are reduce by amounts lower than about 0.15%. Also, assuming the reduction in the average distance between atoms in dense CPODE regions is $RD_{dense}$, and the reduction in the average distance between atoms in iso CPODE regions is $RD_{iso}$, the absolute value of difference ($RD_{dense}-RD_{iso}$) is smaller than 10% of either one of the $RD_{dense}$ and $RD_{iso}$. This indicates that by using the embodiments of the present disclosure, the stresses are not only reduced, they also become more uniform.

Figure 15:
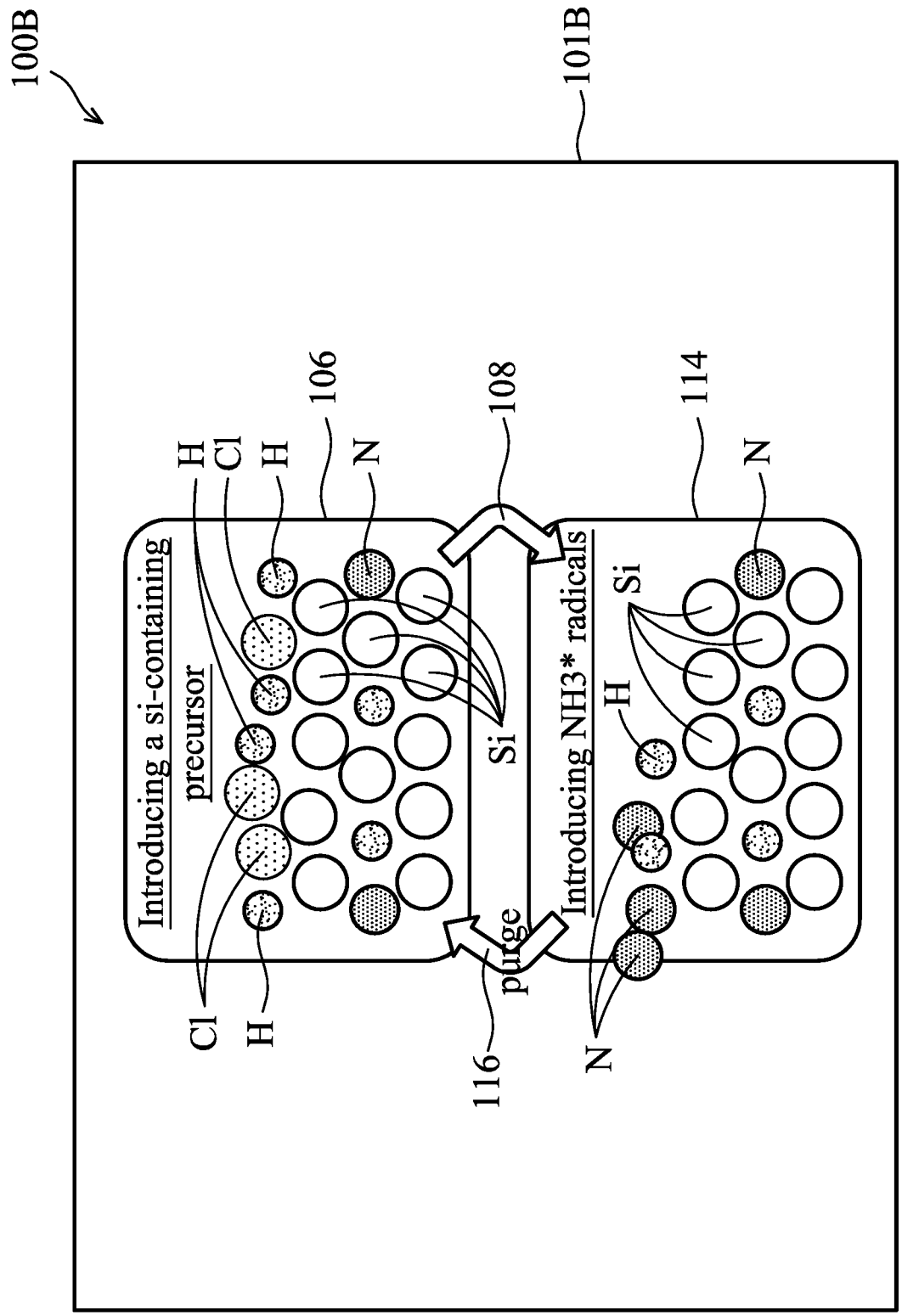

In the formation of transistors, some silicon nitride layers prefer low stresses, and may be formed using process 100A (FIG. 14), while other silicon nitride layers prefer high stresses, and may be formed using process 100B (FIG. 15). FIG. 15 illustrates process 100B for forming a silicon nitride layer using ALD. This process is performed in ALD chamber 101B, and may include steps 106, 108, 114, and 116 (FIG. 14). The steps of introducing hydrogen radicals, the subsequent purging of the hydrogen radicals, and the bombardment as shown in FIG. 14 are skipped in process 100B. Steps 106, 108, 114, and 116 may be similar to the corresponding steps shown in FIG. 14, and hence the details are not repeated. Advantageously, in accordance with some embodiments of the present disclosure, depending on different requirement, process 100A (FIG. 14) and process 100B (FIG. 15) may be selected to form different layers of a wafer/die. The silicon nitride layer formed using process 100B may have a high stress, which tend to be tensile. The stress may be greater than about 1 GPa.

Figure 16:
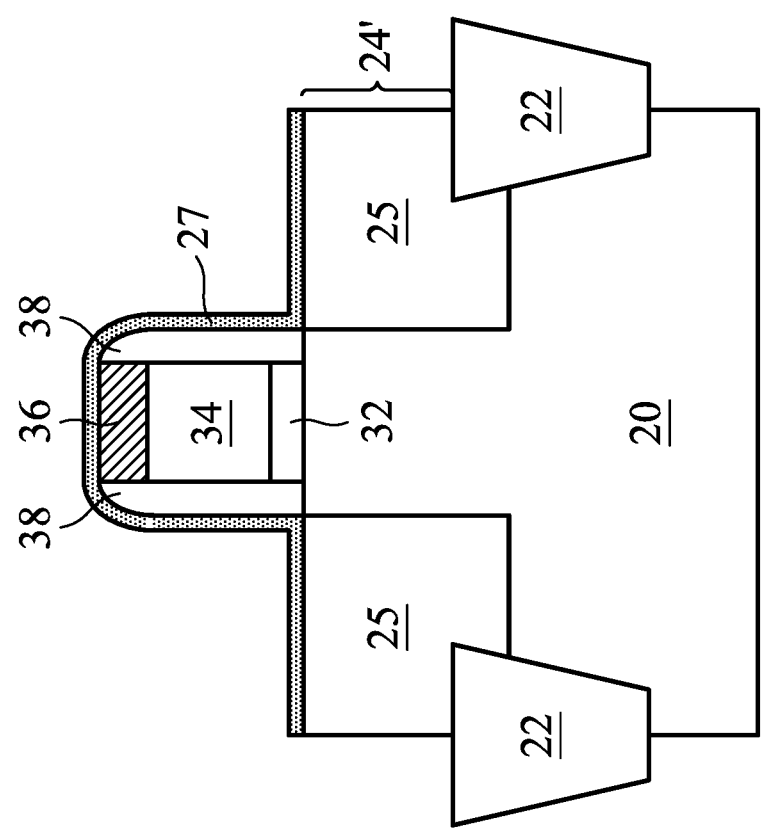
FIGS. 16 and 17 illustrate the cross-sectional views of intermediate stages in the formation of dislocations using strained silicon nitride layers in accordance with some embodiments.
Figure 17:
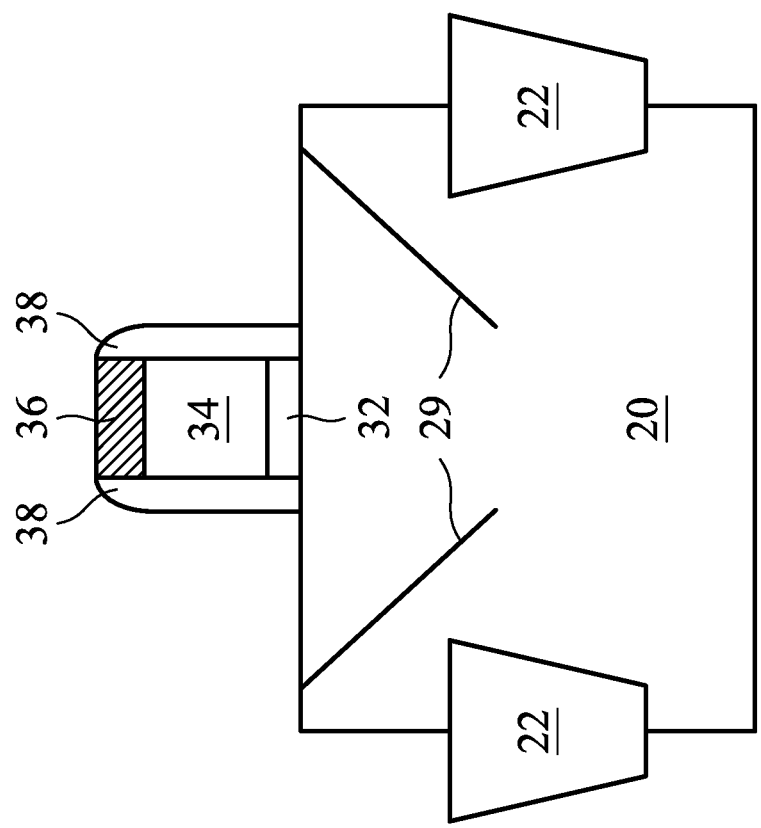

FIGS. 16 and 17 illustrate an example of using a high-stress silicon nitride layer to form dislocation planes. Dislocation planes will extend into source/drain regions. The dislocation planes may desirably increase the strain in the channel regions of transistors, and hence may increase the saturation currents of the transistors. The process shown in FIGS. 16 and 17 may be performed after the process shown in FIG. 3, and before the process shown in FIG. 4.

Referring to FIG. 16, a pre-amorphization implantation (PAI, also sometimes referred to as pre-amorphous implantation) is performed for forming PAI regions 25 in semiconductor fin 24'. In accordance with some embodiments, silicon or germanium is implanted. In accordance with other embodiments, inert gases such as neon, argon, xenon, and radon are implanted.

Next, strained capping layer 27 is formed. The material of strained capping layer 27 may include silicon nitride, titanium nitride, oxynitride, oxide, SiGe, SiC, SiON, or combinations thereof. Strained capping layer 27 has a high stress. When strained capping layer 27 is formed of silicon nitride, process 100B (FIG. 15) is used, so that the stress in strained capping layer 27 is high. The stress may be higher than about 1.0 GPa.

An anneal is then performed, for example, using Rapid Thermal Anneal (RTA), thermal spike RTA anneal, or other anneal methods. In accordance with some embodiments, the anneal is performed using spike RTA, with the annealing temperature being between about 950° C. and about 1,050° C., for about 3 ms to about 5 seconds, for example. As a result of the anneal, PAI regions 25 as shown in FIG. 16 are recrystallized with a memorized stress obtained from strained capping layer 27. As the result of the annealing, dislocation planes 29 are formed, as shown in FIG. 17. Accordingly, a stress may be applied to the channel region of the resulting FinFET, so that the drive current of the FinFET is improved. Although illustrated as lines in the cross-sectional view shown in FIG. 17, dislocation planes 29 are planes that extend in the longitudinal direction of dummy gate stack 30. After the anneal, the strained capping layer 27 (FIG. 17) is removed. The process then proceeds to the process shown in FIG. 4.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The embodiments of the present disclosure have some advantageous features. By performing hydrogen treatment and/or bombardment, the stress in the silicon nitride layers used in cut-PODE processes is reduced, and hence the drift in the threshold voltage in FinFETs is more uniform.

In accordance with some embodiments of the present disclosure, a method includes etching a first portion and a second portion of a dummy gate stack to form a first opening and a second opening, respectively; depositing a first silicon nitride layer to fill the first opening and the second opening, wherein the depositing the first silicon nitride layer comprises a first process selected from treating the first silicon nitride layer using hydrogen radicals, implanting the first silicon nitride layer, and combinations thereof; etching a third portion of the dummy gate stack to form a trench; etching a semiconductor fin underlying the third portion to extend the trench down into a bulk portion of a semiconductor substrate underlying the dummy gate stack; and depositing a second silicon nitride layer into the trench. In an embodiment, the first process comprises treating the first silicon nitride layer using hydrogen radicals. In an embodiment, the depositing the first silicon nitride layer comprises ALD, and the treating is performed in each of ALD cycles. In an embodiment, the depositing the first silicon nitride layer comprises ALD, and the treating is performed once per plurality of ALD cycles. In an embodiment, the depositing the first silicon nitride layer further comprises implanting the first silicon nitride layer with argon. In an embodiment, the depositing the first silicon nitride layer comprises ALD, and the ALD comprises a plurality of ALD cycles, and the implanting is performed after each of a plurality of ALD cycles. In an embodiment, the depositing the first silicon nitride layer comprises Chemical Vapor Deposition (CVD), and the implanting includes a plurality of implantation processes, each performed after a sub layer of the first silicon nitride layer is deposited. In an embodiment, the depositing the second silicon nitride layer comprises a second process selected from treating the second silicon nitride layer using hydrogen radicals, implanting the second silicon nitride layer, and combinations thereof. In an embodiment, the method further includes depositing a third silicon nitride layer on the dummy gate stack, wherein the depositing the third silicon nitride layer is free from treating the third silicon nitride layer using hydrogen radicals, and is free from implanting the third silicon nitride layer.

In accordance with some embodiments of the present disclosure, a method includes forming a dummy gate stack on a semiconductor fin in a wafer, wherein the semiconductor fin protrudes higher than isolation regions on opposite sides of the semiconductor fin; etching the dummy gate stack to form an opening; and in a process chamber, filling the opening with a silicon nitride layer using ALD, wherein the ALD comprises a first plurality of ALD cycles, each comprising: introducing a silicon-containing precursor into the process chamber; purging the silicon-containing precursor from the process chamber; introducing hydrogen radicals into the process chamber; purging the hydrogen radicals from the process chamber; introducing a nitrogen-containing precursor into the process chamber; and purging the nitrogen-containing precursor from the process chamber. In an embodiment, the ALD further comprises a second plurality of ALD cycles, wherein each of the second plurality of ALD cycles is free from introducing hydrogen radicals into the process chamber. In an embodiment, one of the first plurality of ALD cycles and the second plurality of ALD cycles comprises implanting argon into the silicon nitride layer. In an embodiment, each of a plurality of processes selected from the first plurality of ALD cycles and the second plurality of ALD cycles is followed by implanting argon into the silicon nitride layer. In an embodiment, the method further includes: forming a plurality of sample wafers comprising sample silicon nitride layers, wherein the sample silicon nitride layers are formed using different numbers of hydrogen radical treatments for a certain number of ALD cycles; and determining an optimum number of hydrogen radical treatments to be adopted in the certain number of ALD cycles, wherein the optimum number of hydrogen radical treatments results in a respective stress introduced by a respective one of the sample silicon nitride layer to be lowest among the sample silicon nitride layers, wherein the silicon nitride layer in the wafer is deposited using the optimum number. In an embodiment, the method further includes generating the hydrogen radicals using remote plasma. In an embodiment, the method further includes etching the semiconductor fin to extend the opening into a bulk portion of a semiconductor substrate underlying the semiconductor fin.

In accordance with some embodiments of the present disclosure, a method includes forming a silicon nitride layer on a wafer using ALD, wherein the forming the silicon nitride layer comprises forming a plurality of sub-layers; and performing a plurality of treatments on the silicon nitride layer using hydrogen radicals, wherein each of the plurality of treatments is performed after one of the plurality of sub-layers is formed. In an embodiment, the silicon nitride layer comprises a plurality of atomic layers formed atomic-layer-by-atomic-layer, and the plurality of treatments comprise a treatment performed for each of the plurality of atomic layers. In an embodiment, the silicon nitride layer comprises a plurality of atomic layers formed atomic-layer-by-atomic-layer, and the plurality of atomic layers comprises a first atomic layer; a second atomic layer over and contacting the first atomic layer; and a third atomic layer over and contacting the second atomic layer, wherein one of the plurality of treatments is performed after the first atomic layer is formed and before the second atomic layer is formed, and no treatment using hydrogen radicals is performed after the second atomic layer is formed and before the third atomic layer is formed. In an embodiment, the method further includes performing a plurality of implantations on the silicon nitride layer.

In accordance with some embodiments of the present disclosure, a structure includes a die, which includes a semiconductor substrate; a first region having a first CPODE density, wherein the first region comprises first CPODE regions, and the first region is an iso CPODE region; a second region having a second CPODE density, wherein the second region comprises second CPODE regions, and the second region is a dense CPODE region, with the second CPODE density being greater than the first CPODE density; a first semiconductor fin in the first region; a first dielectric plug extending into the first semiconductor fin to separate the first semiconductor fin into a first portion and a second portion; a second semiconductor fin in the second region; and a second dielectric plug extending into the second semiconductor fin to separate the second semiconductor fin into a third portion and a fourth portion, wherein atoms in the first region have a first average distance, and atoms in the second region have a second average distance, and the first average distance is substantially equal to the second average distance. In an embodiment, a ratio of the first CPODE density to the second CPODE density is greater than about 5. In an embodiment, a first reduction in an average distance between atoms in first CPODE regions is $RD_{iso}$, and a second reduction in an average distance between atoms in the second CPODE regions is $RD_{dense}$, and an absolute value of difference ($RD_{dense}-RD_{iso}$) is smaller than 10% of either one of the $RD_{dense}$ and $RD_{iso}$, and the first reduction and the second reduction are calculated comparing to average distances of respective ones of the first and the second CPODE regions under no stress. In an embodiment, the first CPODE regions and the second CPODE regions comprise silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a first portion and a second portion of a dummy gate stack to form a first opening and a second opening, respectively;
   depositing a first silicon nitride layer to fill the first opening and the second opening, wherein the depositing the first silicon nitride layer comprises a first process, wherein the first process comprises implanting the first silicon nitride layer with nitrogen;
   etching a third portion of the dummy gate stack to form a trench;
   etching a semiconductor fin underlying the third portion to extend the trench down into a bulk portion of a semiconductor substrate underlying the dummy gate stack; and
   depositing a second silicon nitride layer into the trench.
2. The method of claim 1, wherein the first process comprises treating the first silicon nitride layer using hydrogen radicals.
3. The method of claim 2, wherein the depositing the first silicon nitride layer comprises Atomic Layer Deposition (ALD), and the treating is performed in each of ALD cycles.
4. The method of claim 2, wherein the depositing the first silicon nitride layer comprises Atomic Layer Deposition (ALD), and the treating is performed once per plurality of ALD cycles.
5. The method of claim 1, wherein the implanting is performed using an energy in a range between about 1 keV and about 5 keV.
6. The method of claim 1, wherein the first process further comprises generating hydrogen radicals using a process gas comprising hydrogen and free from silicon and nitrogen, and using the hydrogen radicals to treat the first silicon nitride layer.
7. The method of claim 1, wherein the implanting includes a plurality of implantation processes, each performed after a sub layer of the first silicon nitride layer is deposited.
8. The method of claim 1, wherein the depositing the second silicon nitride layer comprises a second process selected from treating the second silicon nitride layer using hydrogen radicals, implanting the second silicon nitride layer, and combinations thereof.
9. The method of claim 1 further comprising depositing a third silicon nitride layer on the dummy gate stack, wherein the depositing the third silicon nitride layer is free from treating the third silicon nitride layer using hydrogen radicals, and is free from implanting the third silicon nitride layer.
10. A method comprising:
    forming a dummy gate stack on a semiconductor fin in a wafer, wherein the semiconductor fin protrudes higher than isolation regions on opposite sides of the semiconductor fin;
    etching the dummy gate stack to form an opening; and
    in a process chamber, filling the opening with a silicon nitride layer using Atomic Layer Deposition (ALD), wherein the ALD comprises a first plurality of ALD cycles, each comprising:
       introducing a silicon-containing precursor into the process chamber;
       purging the silicon-containing precursor from the process chamber;
       introducing hydrogen radicals into the process chamber;
       purging the hydrogen radicals from the process chamber;
       introducing a nitrogen-containing precursor into the process chamber; and
       purging the nitrogen-containing precursor from the process chamber.
11. The method of claim 10, wherein the ALD further comprises a second plurality of ALD cycles, wherein each of the second plurality of ALD cycles is free from introducing hydrogen radicals into the process chamber.
12. The method of claim 11, wherein one of the first plurality of ALD cycles and the second plurality of ALD cycles comprises bombarding argon into the silicon nitride layer.
13. The method of claim 10 further comprising generating the hydrogen radicals using a process gas, wherein the process gas is free from silicon and nitrogen.
14. The method of claim 10 further comprising:
    forming a plurality of sample wafers comprising sample silicon nitride layers, wherein the sample silicon nitride layers are formed using different numbers of hydrogen radical treatments for a certain number of ALD cycles; and
    determining an optimum number of hydrogen radical treatments to be adopted in the certain number of ALD cycles, wherein the optimum number of hydrogen radical treatments results in a respective stress introduced by a respective one of the sample silicon nitride layer to be lowest among the sample silicon nitride layers, wherein the silicon nitride layer in the wafer is deposited using the optimum number.
15. The method of claim 10 further comprising generating the hydrogen radicals using remote plasma.
16. The method of claim 10 further comprising etching the semiconductor fin to extend the opening into a bulk portion of a semiconductor substrate underlying the semiconductor fin.

17. A method comprising:
etching a dummy gate stack to form an opening;
forming a silicon nitride layer extending into the opening using Atomic Layer Deposition (ALD), wherein the forming the silicon nitride layer comprises forming a plurality of sub-layers;
generating hydrogen radicals using a process gas, wherein the process gas is free from silicon and nitrogen; and
performing a plurality of treatments on the silicon nitride layer using the hydrogen radicals, wherein each of the plurality of treatments is performed after one of the plurality of sub-layers is formed.

18. The method of claim 17, wherein the silicon nitride layer comprises a plurality of atomic layers formed atomic-layer-by-atomic-layer, and the plurality of treatments comprise a treatment performed for each of the plurality of atomic layers.

19. The method of claim 17, wherein the silicon nitride layer comprises a plurality of atomic layers formed atomic-layer-by-atomic-layer, and the plurality of atomic layers comprises:
a first atomic layer;
a second atomic layer over and contacting the first atomic layer; and
a third atomic layer over and contacting the second atomic layer, wherein one of the plurality of treatments is performed after the first atomic layer is formed and before the second atomic layer is formed, and no treatment using hydrogen radicals is performed after the second atomic layer is formed and before the third atomic layer is formed.

20. The method of claim 17 further comprising performing a plurality of implantations on the silicon nitride layer.

* * * * *